(12) United States Patent
Sameshima et al.

(10) Patent No.: US 8,071,468 B2
(45) Date of Patent: Dec. 6, 2011

(54) SEMICONDUCTOR DEVICE AND METHOD OF MANUFACTURING SEMICONDUCTOR DEVICE

(75) Inventors: Hideyuki Sameshima, Tokyo (JP); Tomoo Ono, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 12/656,555

(22) Filed: Feb. 3, 2010

(65) Prior Publication Data
US 2010/0203723 A1 Aug. 12, 2010

(30) Foreign Application Priority Data
Feb. 6, 2009 (JP) .................. 2009-026480

(51) Int. Cl.
*H01L 21/44* (2006.01)
(52) U.S. Cl. ........ 438/598; 438/618; 438/631; 438/637; 257/E21.575; 257/E21.58; 257/E21.582
(58) Field of Classification Search ........... 257/E21.045, 257/E21.061
See application file for complete search history.

(56) References Cited

U.S. PATENT DOCUMENTS

2006/0220215 A1* 10/2006 Lee ................................ 257/691
2007/0241460 A1* 10/2007 Mis et al. ...................... 257/764

FOREIGN PATENT DOCUMENTS

JP       2002-252310 A      9/2002

* cited by examiner

*Primary Examiner* — Cheung Lee
(74) *Attorney, Agent, or Firm* — Rabin & Berdo, P.C.

(57) ABSTRACT

There is provided a method of manufacturing a semiconductor device, the method including performing at least one of: processing, when forming the first redistribution layer, of forming the first electrically conductive material layer by growing the first electrically conductive material using electroplating, and polishing the first resist film and the first electrically conductive material layer from the main surface side to flatten their surfaces; and processing, when forming the second redistribution layer, forming the second electrically conductive material layer by growing the second electrically conductive material using electroplating, and polishing the second resist film and the second electrically conductive material layer from the main surface side to flatten their surfaces.

8 Claims, 25 Drawing Sheets

SEMICONDUCTOR DEVICE AND METHOD OF MANUFACTURING SEMICONDUCTOR DEVICE

CROSS-REFERENCE TO RELATED APPLICATION

This application is based on and claims priority under 35 USC 119 from Japanese Patent Application No. 2009-026480 filed on Feb. 6, 2009, the disclosure of which is incorporated by reference herein.

BACKGROUND

1. Technical Field

The present invention relates to a semiconductor device and to a method of manufacturing method thereof, and in particular to a WCSP semiconductor device having a multilayer redistribution structure and a manufacturing method thereof.

2. Related Art

In conventional integrated circuit packages of packaged semiconductor chips, such as semiconductor integrated circuits and the like, demands are increasing for size reduction and reduction in thickness. Recently, development is progressing in Chip Sized Packages (CSP's), centered around integrated circuit packages in fields with particular demands for reduced thickness. CSP's have spherical shaped external connection terminals, called bumps, disposed in a lattice on the surface of a semiconductor chip. A structural body that includes plural individual semiconductor devices formed on a semiconductor wafer by wafer processing, from which CSP's are obtained by dicing, is referred to as a WCSP (Wafer-level Chip Size Package).

Recently, multilayer redistribution structures are being introduced even in WCSP's, in order to obtain a higher degree of integration. In such multilayer redistribution structure WCSP's, in order to obtain an even higher degree of integration, a "stacked structure", formed by via portions corresponding to each layer superimposed on an electrode pad, is proposed (Japanese Patent Application Laid-Open (JP-A) No. 2002-252310). So-called stacked vias exist. For example, FIG. 2 of JP-A No. 2002-252310 is a diagram of a WCSP having a structure of a first metal layer (redistribution layer) formed on a semiconductor wafer 2, with a first insulating pattern layer in between, so as to be connected to a signal electrode pad 4a, and with a second metal layer (redistribution layer) additionally formed thereon, with a second insulating layer in between.

However, there is the problem that in a conventional multilayer redistribution structure WCSP there is variation in the thickness of the redistribution layers along the wafer surface, generating variation in the electrical properties, as represented by the Quality Factor, or the like. In particular, there is significant variation in electrical properties in WCSP's of stacked structure. For example, in the structure shown in FIG. 2 of JP-A No. 2002-252310, due to the step in the vicinity of the opening of the signal electrode pad 4a portion, and the like, local variation is generated in the thickness of the first metal layer (redistribution layer) formed thereon. Furthermore, there is also variation in the thickness of the second insulating layer formed on the first metal layer, and there is also variation in the thickness of the second metal layer (redistribution layer) formed on the second insulating layer. As a result, there is variation in the thickness of the redistribution layers of the WCSP overall.

In a process where redistribution layers are grown by "electroplating", variation in thickness of the redistribution layers has conventionally been controlled by controlling various parameters, such as the current density, electroplating flow rate, and the like. However, demands for raised electrical properties, such as Quality Factor, have recently been increasing, and a further reduction in the variation in thickness of the redistribution layers is required. It has become difficult to contain the variation within the desired range by means of conventional parameter control alone.

SUMMARY

The present invention is made in order to solve the above problem, and an object of the present invention is to provide a WCSP semiconductor device of multilayer redistribution structure in which variation in thickness of redistribution layers along the wafer surface is reduced and desired electrical properties can be obtained, and to provide a manufacturing method of the same.

The first aspect of the present invention provides a method of manufacturing a semiconductor device, the method including:

preparing a semiconductor substrate formed with an electrode pad on a main surface side;

forming a first insulating layer from an insulating material so as to cover the main surface of the electrode pad and the semiconductor substrate;

forming a first opening in the first insulating layer such that a portion of the electrode pad is exposed;

forming a first electrically conductive layer containing a first electrically conductive material so as to cover the electrode pad and the first insulating layer;

forming a first resist film on the first electrically conductive layer except in a portion where a first redistribution layer is to be formed;

forming the first redistribution layer from the first electrically conductive material on the first electrically conductive layer, by growing the first electrically conductive material contained in the first electrically conductive layer using an electroplating method, and removing the first resist film;

forming a second insulating layer from an insulating material so as to cover the first redistribution layer and the first insulating layer;

forming a second opening in the second insulating layer such that a portion of the first redistribution layer is exposed;

forming a second electrically conductive layer containing a second electrically conductive material so as to cover the first redistribution layer and the second insulating layer;

forming a second resist film on the second electrically conductive layer except in a portion where a second redistribution layer is to be formed;

forming the second redistribution layer from the second electrically conductive material on the second electrically conductive layer, by growing the second electrically conductive material contained in the second electrically conductive layer using an electroplating method, and removing the second resist film; and performing at least one of:
processing, when forming the first redistribution layer, of forming the first electrically conductive material layer by growing the first electrically conductive material using electroplating, and polishing the first resist film and the first electrically conductive material layer from the main surface side to flatten their surfaces; and
processing, when forming the second redistribution layer, forming the second electrically conductive material layer by growing the second electrically conductive material using electroplating, and polishing the second resist film and the second electrically conductive material layer from the main surface side to flatten their surfaces.

The second aspect of the present invention provides the method of the first aspect, wherein the first opening and the second opening are formed such that a via portion of the second redistribution layer formed above the first redistribution layer is superimposed in a stacking direction on a via portion of the first redistribution layer formed above the electrode pad, so as to form a stacked structure.

The third aspect of the present invention provides the method of the first aspect, wherein at least one of the first electrically conductive material layer and the second electrically conductive material layer is polished from the main surface side flattening the surface thereof, and at least one of the first insulating layer and the second insulating layer is polished from the main surface side flattening the surface thereof.

The fourth aspect of the present invention provides the method of the first aspect, wherein polishing is performed by a grinder.

The fifth aspect of the present invention provides the method of the first aspect, wherein:

the processing for forming the first redistribution layer is performed so that when the first resist film and the first electrically conductive layer are polished from the main surface side to flatten the surfaces thereof, the first resist film is removed after the surfaces have been flattened; and the processing for forming the second redistribution layer is performed so when the second resist film and the second electrically conductive layer are polished from the main surface side to flatten the surfaces thereof, the second resist film is removed after the surfaces have been flattened.

The sixth aspect of the present invention provides the method of the first aspect, wherein polishing is performed across the entire main surface of the semiconductor substrate.

The seventh aspect of the present invention provide the method of the first aspect, wherein:

the processing for forming the first redistribution layer is performed so that when the first resist film and the first electrically conductive material layer are polished from the main surface side to flatten the surfaces thereof, the first electrically conductive material layer is formed by growing the first electrically conductive material using electroplating so as not to exceed a height of the first resist film, and the first resist film is removed after the first electrically conductive material layer has been polished; and the processing for forming the second redistribution layer is performed so that when the second resist film and the second electrically conductive material layer are polished from the main surface side to flatten the surfaces thereof, the second electrically conductive material layer is formed by growing the second electrically conductive material using electroplating so as not to exceed a height of the second resist film, and the second resist film is removed after the second electrically conductive material layer has been polished.

The eighth aspect of the present invention provides a method of manufacturing a semiconductor device, the method including:

preparing a semiconductor substrate formed, on a main surface side, with a first redistribution layer, and a first insulating layer provided with a first opening exposing a portion of the first redistribution layer;

forming a first electrically conductive layer containing a first electrically conductive material so as to cover the first redistribution layer and the first insulating layer;

forming a first resist film on the first electrically conductive layer except in a portion where a second redistribution layer is to be formed;

forming the second redistribution layer from the first electrically conductive material on the first electrically conductive layer, by growing the first electrically conductive material contained in the first electrically conductive layer using an electroplating method, and removing the first resist film;

forming a second insulating layer from an insulating material so as to cover the second redistribution layer and the first insulating layer;

forming a second opening in the second insulating layer such that a portion of the second redistribution layer is exposed;

forming a second electrically conductive layer containing a second electrically conductive material so as to cover the second redistribution layer and the second insulating layer;

forming a second resist film on the second electrically conductive layer except in a portion where a third redistribution layer is to be formed;

forming the third redistribution layer from the second electrically conductive material on the second electrically conductive layer, by growing the second electrically conductive material contained in the second electrically conductive layer using an electroplating method, and removing the second resist film; and performing at least one of:

processing, when forming the second redistribution layer, of forming the first electrically conductive material layer by growing the first electrically conductive material using electroplating, and polishing the first resist film and the first electrically conductive material layer from the main surface side to flatten their surfaces; and processing, when forming the third redistribution layer, of forming the second electrically conductive material layer by growing the second electrically conductive material using electroplating, and polishing the second resist film and the second electrically conductive material layer from the main surface side to flatten their surfaces.

The ninth aspect of the present invention provides a semiconductor device including:

a semiconductor substrate formed with an electrode pad on a main surface side;

a first insulating layer formed on the electrode pad and the semiconductor substrate, the first insulating layer provided with a first opening exposing the electrode pad;

a first redistribution layer formed on the electrode pad and the first insulating layer, the first redistribution layer being electrical connected to the electrode pad through a first electrically conductive layer;

a second insulating layer formed on the first insulating layer and the first redistribution layer, the second insulating layer provided with a second opening exposing the first redistribution layer; and a second redistribution layer formed on the first redistribution layer and the second insulating layer, the second redistribution layer being electrical connected to the first redistribution layer through a second electrically conductive layer, wherein the surface of at least one of the first redistribution layer and the second redistribution layer has been flattened by polishing from the main surface side.

The tenth aspect of the present invention provides the semiconductor device of the ninth aspect, having a stacked structure in which a via portion of the first redistribution layer formed above the electrode pad, and a via portion of the second redistribution layer formed above the first redistribution layer, are superimposed in a stacking direction.

The eleventh aspect of the present invention provides a semiconductor device including:

a semiconductor substrate formed, on the main surface side, with a first redistribution layer, and a first insulating layer provided with a first opening exposing the first redistribution layer;

a second insulating layer formed on the first redistribution layer and the first insulating layer, the second insulating layer provided with a second opening that exposing the first redistribution layer;

a second redistribution layer formed on the first redistribution layer and the first insulating layer, the second redistribution layer being electrical connected to the first redistribution layer through a first electrically conductive layer;

a third insulating layer formed on the second insulating layer and the second redistribution layer, the third insulating layer provided with a third opening exposing the second redistribution layer; and a third redistribution layer formed on the second redistribution layer and the third insulating layer, the third redistribution layer being electrical connected to the second redistribution layer through a second electrically conductive layer, wherein the surface of at least one of the first redistribution layer, the second redistribution layer, and the third redistribution layer has been flattened by polishing from the main surface side.

The following effects are exhibited by the present invention.

According to a first aspect of the present invention, an effect is exhibited of providing a method of manufacturing a WCSP semiconductor device of multilayer redistribution structure in which the variation in thickness of the redistribution layer along the wafer surface is reduced, and the desired electrical properties can be obtained.

According to the second aspect of the present invention, an greater effect is exhibited from flattening the redistribution layers in a semiconductor device having a stacked structure that is greatly influenced by the base substrate pattern, in comparison to a semiconductor device not having a stacked structure.

According to the third aspect of the present invention, the base substrate pattern is flattened and an effect is exhibited of further reducing variation in thickness of the redistribution layers along the wafer surface for the WCSP semiconductor device overall.

According to the fourth aspect of the present invention, an effect is exhibited of being able to easily introduce the polishing process into the manufacturing processes of the WCSP.

According to the fifth aspect of the present invention, an effect is exhibited of the resist film acting as a protective film in the polishing processes.

According to the sixth aspect of the present invention, an effect is exhibited of reducing the variation in the thickness of the redistribution layers along the wafer surface for the wafer overall.

According to the seventh aspect of the present invention, an effect is exhibited of enabling problems during the polishing processing, such as the grinder catching or the like, to be reduced.

According to the eighth aspect of the present invention, an effect is exhibited of providing a manufacturing method for a WCSP semiconductor device of multilayer redistribution structure in which, even though there is a multilayer redistribution structure across several layers, the variation in thickness of the redistribution layer along the wafer surface is reduced, and the desired electrical properties can be obtained.

According to the ninth aspect of the present invention, an effect is exhibited of providing a WCSP semiconductor device of multilayer redistribution structure in which the variation in thickness of the redistribution layer along the wafer surface is reduced, and the desired electrical properties can be obtained.

According to the tenth aspect of the present invention, an greater effect is exhibited from flattening the redistribution layers in a semiconductor device having a stacked structure that is greatly influenced by the base substrate pattern, in comparison to a semiconductor device not having a stacked structure. Namely, the variation in thickness of redistribution layers along the wafer surface is further reduced, and desired electrical properties can be obtained.

According to the eleventh aspect of the present invention, the base substrate pattern is flattened and an effect is exhibited of further reducing variation in thickness of the redistribution layers along the wafer surface for the WCSP semiconductor device overall.

According to the twelfth aspect of the present invention, an effect is exhibited of providing a WCSP semiconductor device of multilayer redistribution structure in which, even though there is a multilayer redistribution structure across several layers, the variation in thickness of the redistribution layer along the wafer surface is reduced, and the desired electrical properties can be obtained.

BRIEF DESCRIPTION OF THE DRAWINGS

Exemplary embodiments of the present invention will be described in detail based on the following figures, wherein.

DETAILED DESCRIPTION

A detailed explanation will now be given of an exemplary embodiment of the present invention, with reference to the drawings.

First Exemplary Embodiment

Figure 1:
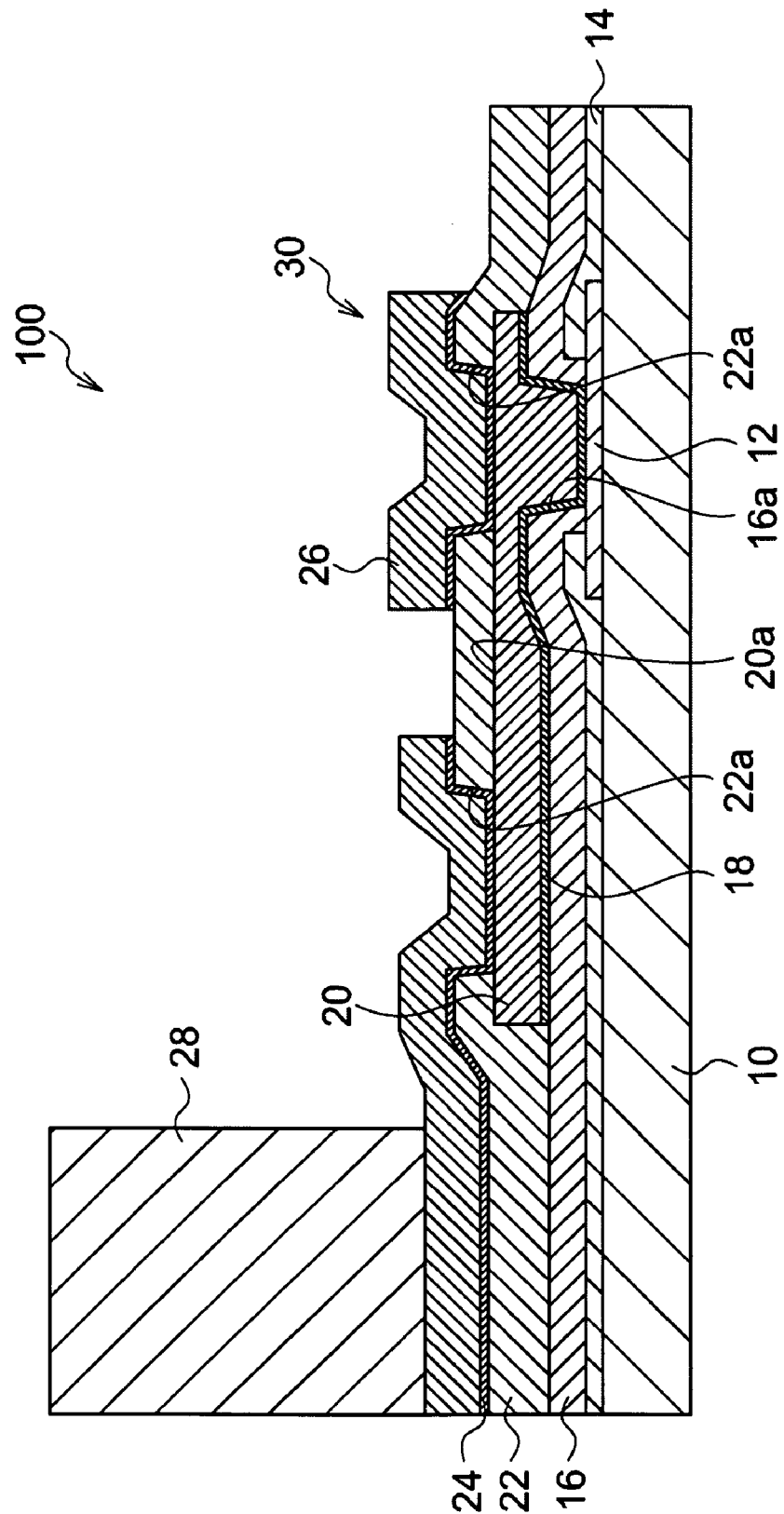
FIG. 1 is a partial cross-section showing an example of a multilayered structure of a semiconductor device according to a first exemplary embodiment of the present invention.

FIG. 1 is a partial cross-section showing an example of a multilayered structure of a semiconductor device according to a first exemplary embodiment of the present invention. A semiconductor device 100 according to the first exemplary embodiment is a WCSP of multilayer redistribution structure, and is equipped with: a semiconductor wafer 10; an electrode pad 12; a passivation film 14; a first insulation layer 16; a first opening 16a; a first under bump metal (UBM) layer 18; a first redistribution layer 20; a second insulating layer 22; a second opening 22a; a second UBM layer 24; a second redistribution layer 26; and a post electrode 28.

In the semiconductor device 100, the surface of the first redistribution layer 20 is made flat, and variation in the thickness of redistribution layers overall is reduced. Furthermore, a stacked structure 30 is formed from the via portions of the first redistribution layer 20 and the second redistribution layer 26 each superimposed on the electrode pad 12. Note that, while not shown in the drawings, the surface of the semiconductor device 100 is covered by a protective film, except for at the end portion of the post electrode 28. An external connection terminal, such as a solder ball or the like, is connected to the post electrode 28, at the end portion that is exposed from the protective film.

Explanation will now be given of the structure of the semiconductor device 100 according to the first exemplary embodiment, following the manufacturing processes thereof. FIG. 2 to FIG. 10 are partial cross-sections representing manufacturing processes of a semiconductor device according to the first exemplary embodiment. A WCSP is a structural body from which CSP's are obtained by dicing into individual semiconductor devices a semiconductor with plural semiconductor devices formed on a semiconductor wafer by wafer processing. In these drawings a partial structure of one electrode pad's worth (one individual semiconductor device) is shown in the drawing and will be explained.

Processes for Forming the First Insulation Layer

Figure 2:
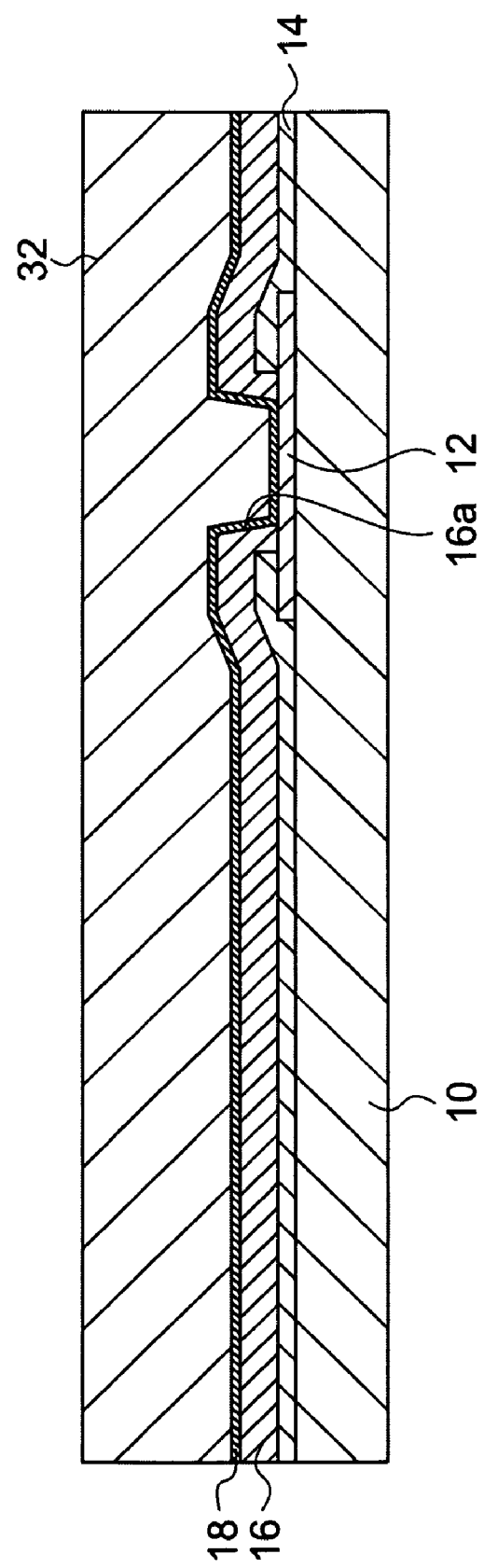
FIG. 2 to FIG. 11 are partial cross-sections representing manufacturing processes of a semiconductor device according to the first exemplary embodiment.

FIG. 2 is a partial cross-section representing a manufacturing process of the first insulation layer 16. First, as shown in FIG. 2, the electrode pad 12 is formed on the surface (main surface side) of the semiconductor wafer 10. Then the passivation film 14 is formed on the semiconductor wafer 10 and the electrode pad 12, so as to expose a portion of the electrode pad 12. Next, the first insulation layer 16 is formed on the surface of the semiconductor wafer 10 using a photosensitive resin, such as (poly)benzoxazole (PBO), or the like. The first opening 16a, for exposing a portion of the electrode pad 12, is formed by photo-exposing and development processing the first insulation layer 16.

Processes for Forming the First Redistribution Layer

As shown in FIG. 2, after the first insulation layer 16 has been formed, the first UBM layer 18 is formed as a film with substantially uniform thickness on the first insulation layer 16, following the undulations of the surface. A first electrically conductive material for forming the first redistribution layer 20 is contained in the first UBM layer 18. The UBM layer is also referred to as a seed layer, and it is a metal thin film for promoting electroplating growth of the redistribution layer, which is going to be formed as the layer above. For example, in the case of copper lines where the electrically conductive material is Cu, the UBM layer is formed of Ti (titanium) and Cu (copper), sequentially deposited using sputtering.

The same electrically conductive material as that of the redistribution layer is employed in the uppermost layer of the UBM layer. In other layers of the UBM layer, Ti, W (tungsten), Au (gold), Pd (palladium), Ni (nickel), or an alloy, such as TiW (titanium-tungsten), for example, are employed according to the electrically conductive material of the redistribution layer. When electroplating copper, electroplating growth can be performed using copper sulfate, copper sulfonate, or the like.

Figure 3:
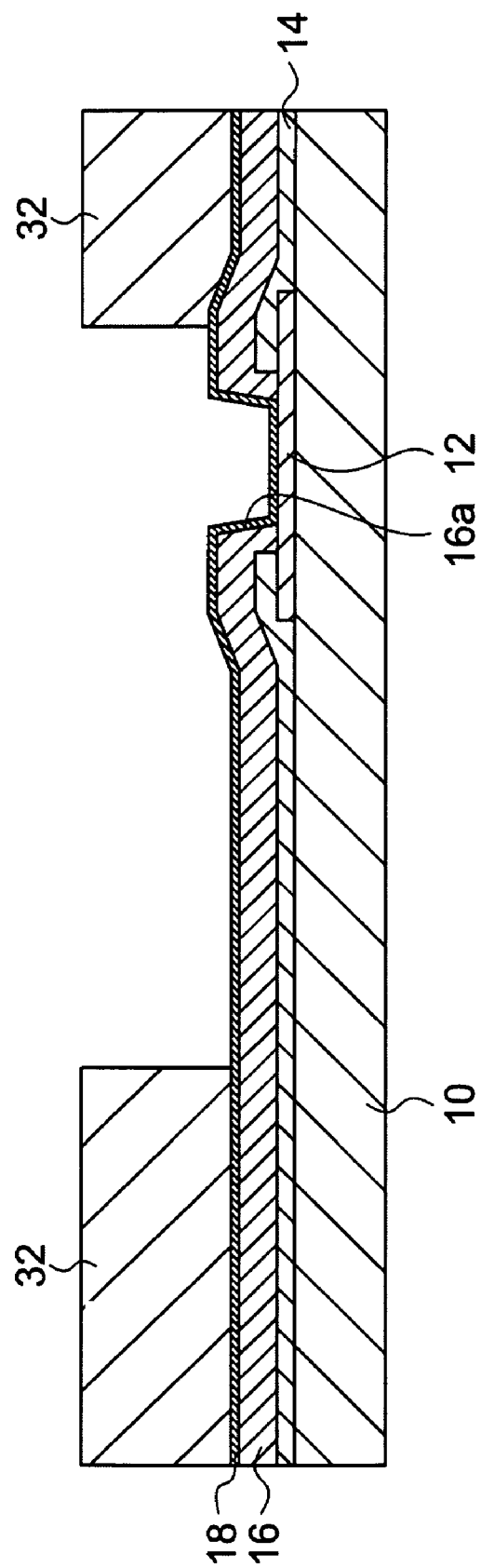

Next, a resist film 32 is formed from a photoresist material on the first UBM layer 18. As shown in FIG. 3, the resist film 32 is patterned by photolithography to give the desired redistribution pattern. Namely, the resist film 32 is removed in the region to be formed with the first redistribution layer 20, exposing the first UBM layer 18 surface.

Figure 4:
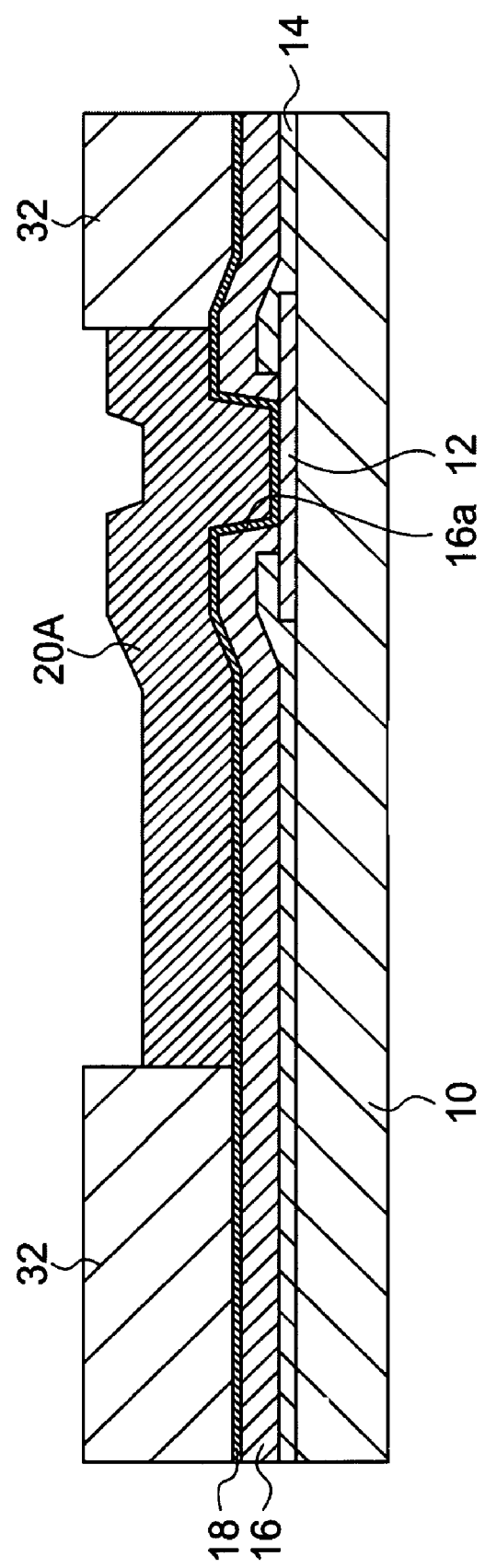

Next, as shown in FIG. 4, the first electrically conductive material is grown using electroplating from the exposed surface of the first UBM layer 18, and a first electrically conductive material layer 20A is formed. The first electrically conductive material layer 20A is formed thicker than a predefined thickness of the first redistribution layer 20. For example, the first electrically conductive material layer 20A is formed such that the first redistribution layer 20 is the predefined thickness (for example, a thickness of about 8 µm) when the first electrically conductive material layer 20A has been polished to the lowest portion.

Figure 5:
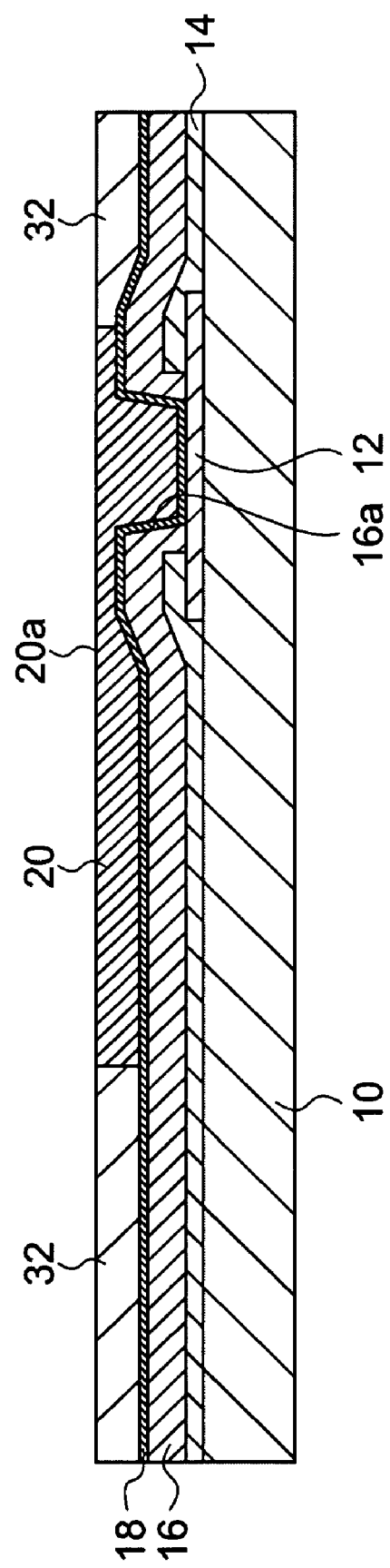

Next, as shown in FIG. 5, the surface formed with the resist film 32 and the first electrically conductive material layer 20A is flattened (planarized) by flattening processing (planarization processing), by polishing of the semiconductor wafer 10 from the main surface side with a grinder, thereby forming the first redistribution layer 20. Polishing with the grinder is performed across the entire main surface of the semiconductor wafer 10. The resist film 32 here acts as a protective film for the base substrate pattern (the structure formed by layers below the resist film 32). Furthermore, where the resist film 32 is present, the blade of the grinder does not readily catch on the first redistribution layer 20, and production reliability is raised. By forming the first electrically conductive material layer 20A so as not to exceed the height of the resist film 32 configuration is made in which the blade of the grinder even less readily catches on the first redistribution layer 20. Furthermore, the resist film 32 prevents machined-off foreign matter from being incorporated in the structure.

Figure 6:
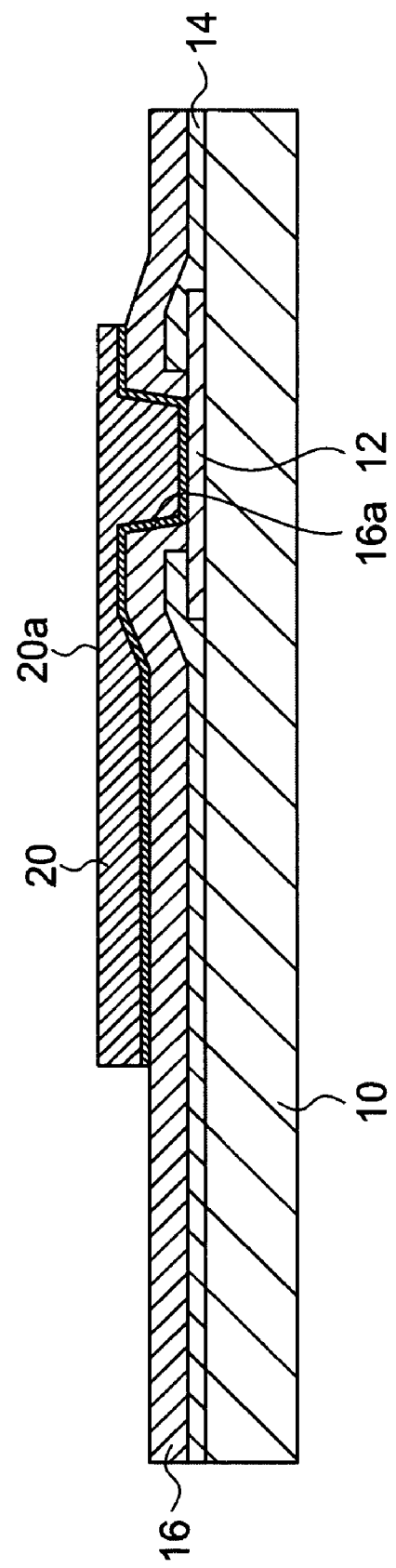

Next, as shown in FIG. 6, the remaining resist film 32 is removed. Subsequently, the portion of the first UBM layer 18 where the first redistribution layer 20 is not stacked is removed. For example, when the UBM layer is formed from Ti and Cu, the Cu layer that has not been grown by electroplating is removed by etching, and then the Ti layer is removed by etching. The surface of the first insulation layer 16 is exposed at the portion where the first UBM layer 18 is removed. The first redistribution layer 20 making contact with the electrode pad 12 is thereby completed.

By the flattening processing described above, the distance between the surface 20a of the first redistribution layer 20 and the surface of the semiconductor wafer 10 is made uniform. Furthermore, the portion of the first redistribution layer 20 formed in the first opening 16a is made thicker than other portions of the first redistribution layer 20. In the present exemplary embodiment, this portion corresponds to the via portion of the first redistribution layer 20.

Processes for Forming Second Insulating Layer

Figure 7:
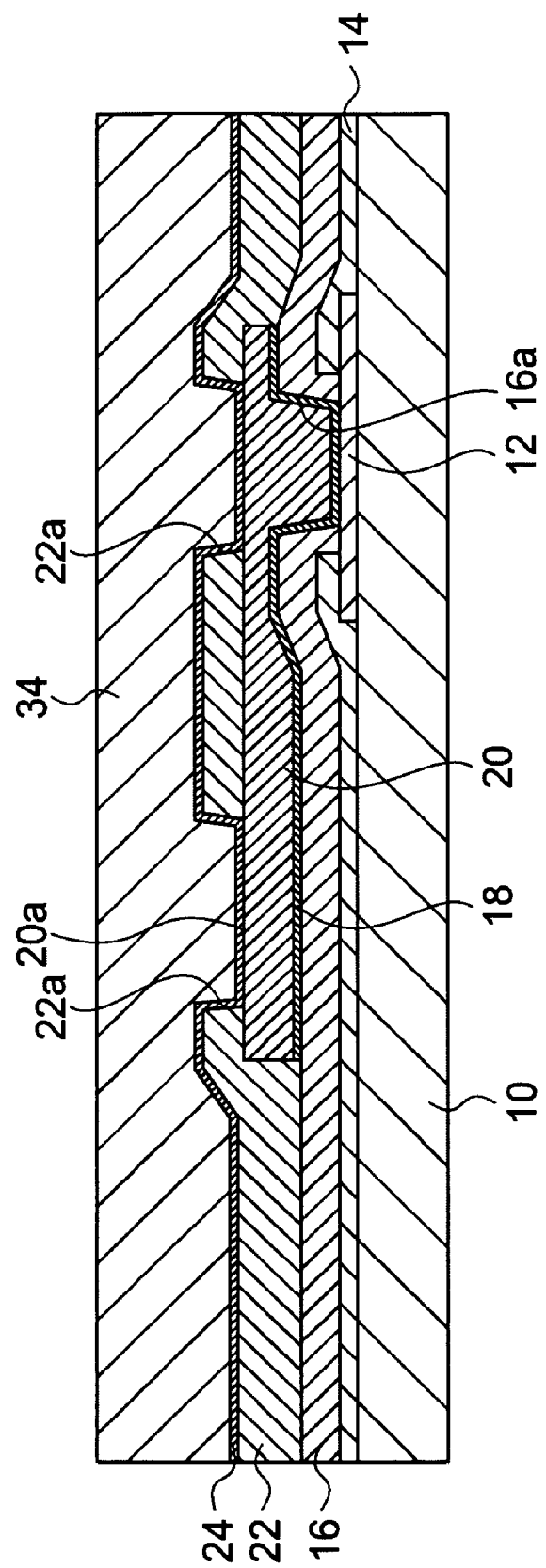

FIG. 7 is a partial cross-section representing a process for forming the second insulating layer 22. As shown in FIG. 7, the second insulating layer 22 is formed from a photosensitive resin, such as PBO or the like, on the main surface of the semiconductor wafer 10 formed with the first redistribution layer 20. The second openings 22a for exposing portions of the first redistribution layer 20 are formed by photo-exposing and development processing the second insulating layer 22. The size of the second opening 22a is larger than the size of the first opening 16a, and the second insulating layer 22 is removed at a portion facing the first opening 16a.

Processes for Forming the Second Redistribution Layer

Figure 8:
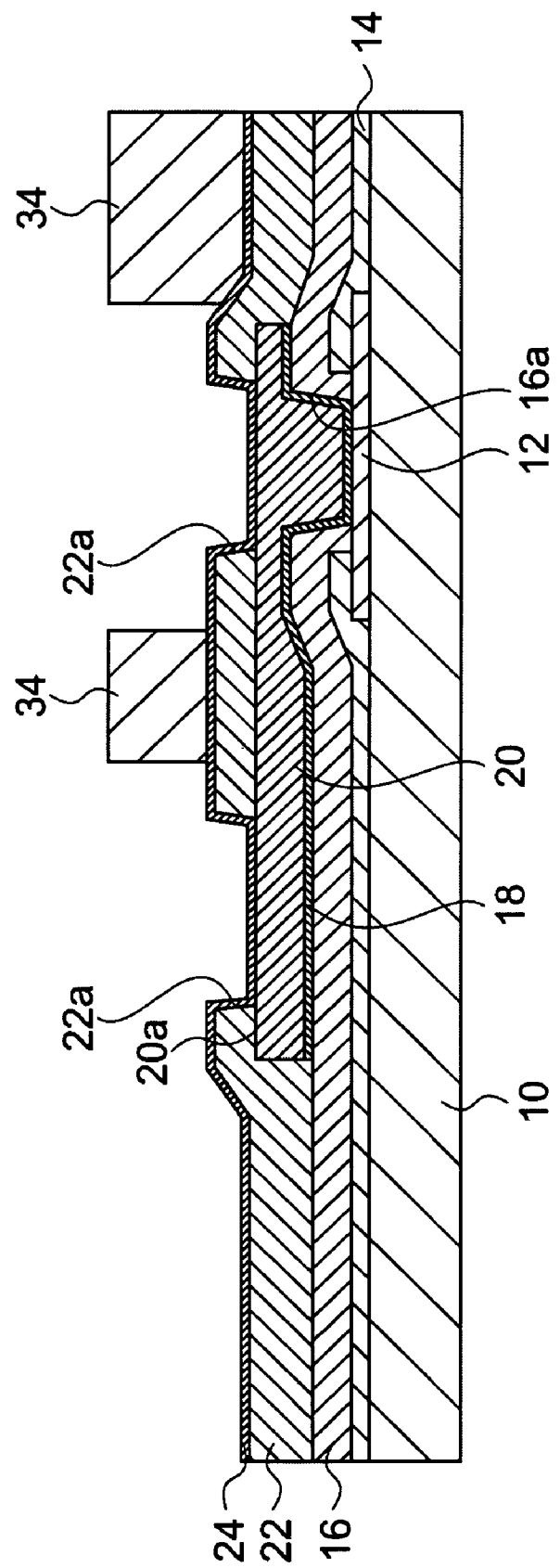

After forming the second insulating layer 22, the second UBM layer 24 is formed as a thin film of substantially uniform thickness on the second insulating layer 22, following the undulations of the surface. A second electrically conductive material for forming the second redistribution layer 26 is contained in the second UBM layer 24. For example, for copper lines, the UBM layer is formed from Ti and Cu. Next, a resist film 34 is formed from a photoresist material on the second UBM layer 24. As shown in FIG. 8, the resist film 34 is patterned with the desired redistribution pattern by photolithography. Namely, the resist film 34 is removed in the region where the second redistribution layer 26 is to be formed, exposing the surface of the second UBM layer 24.

Figure 9:
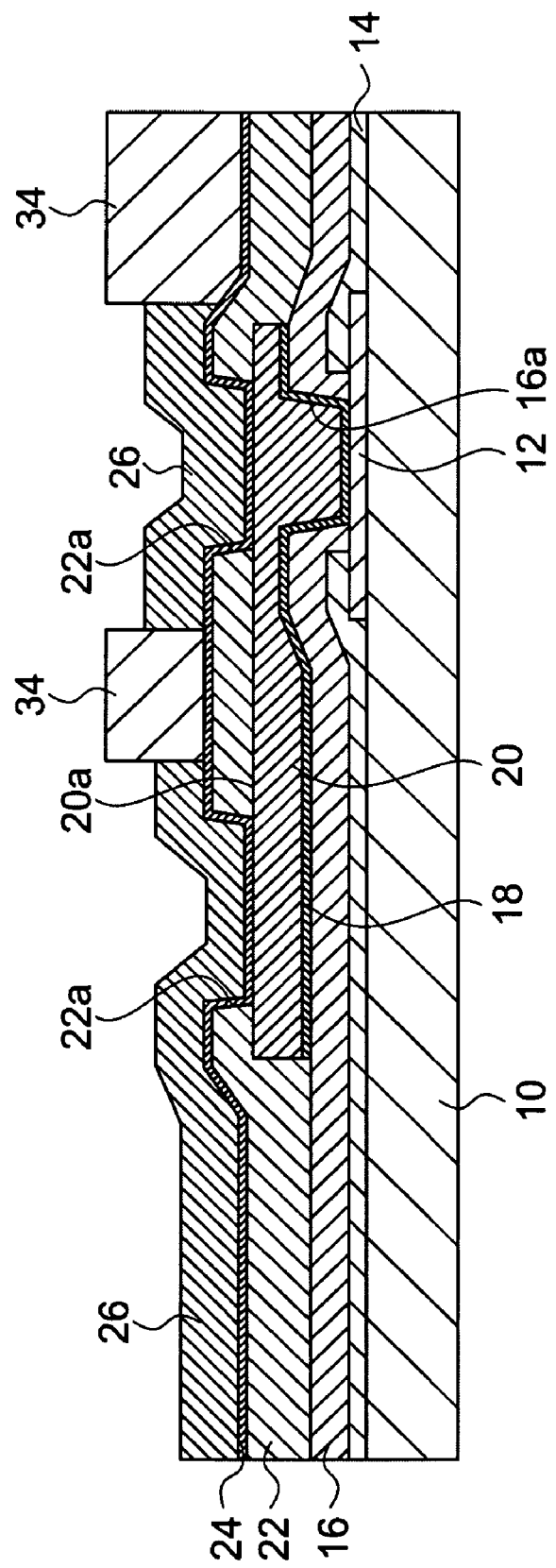
Figure 10:
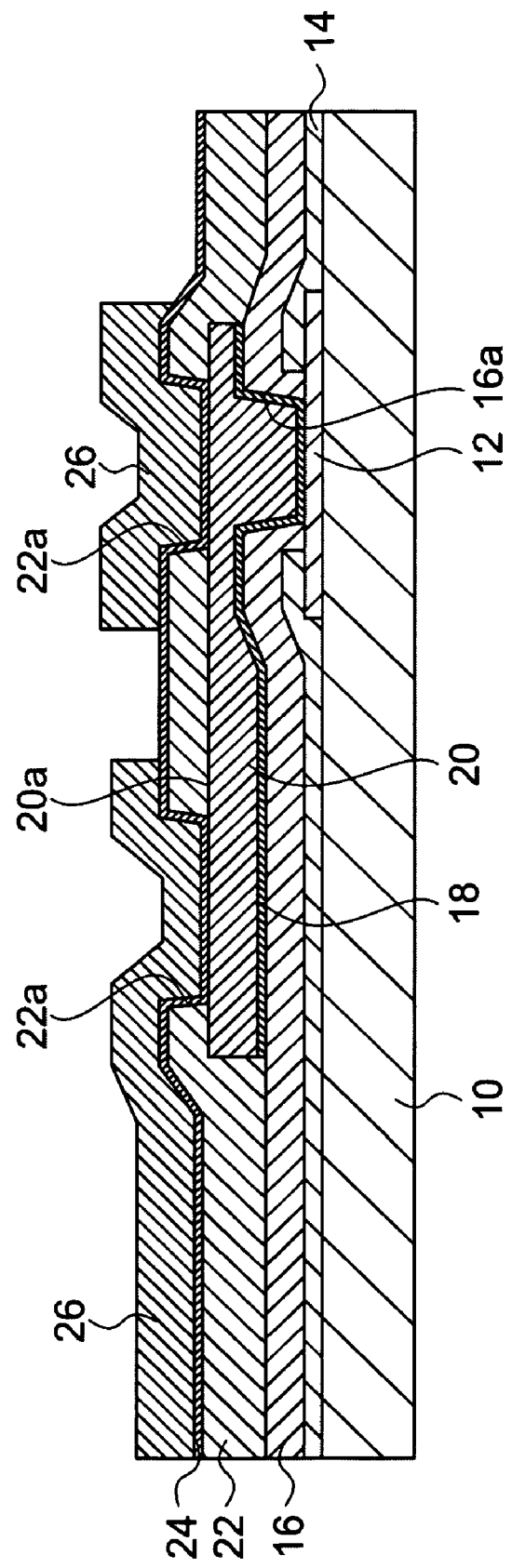

Next, as shown in FIG. 9, the second redistribution layer 26 is formed by growing the second electrically conductive material from the exposed surface of the second UBM layer 24 using electroplating. Next, as shown in FIG. 10, the remaining resist film 34 is removed. The second redistribution layer 26 making contact with the first redistribution layer 20 is thereby completed. The second redistribution layer 26 is formed of substantially uniform thickness following the undulations of the surface, to give a structure that dips inward at the portion where the second opening 22a is formed. In the present exemplary embodiment, this portion corresponds to the via portion of the second redistribution layer 26. The via portion of the second redistribution layer 26 is superimposed on the via portion of the first redistribution layer 20, configuring a stacked structure.

The second redistribution layer 26 is formed of substantially the same thickness as the first redistribution layer 20 (for example a thickness of about 8 μm). The semiconductor device 100 according to the present exemplary embodiment has two redistribution layers, the first redistribution layer 20 and the second redistribution layer 26. Variation in the thickness of the redistribution layer along the wafer surface can be reduced to within ±10% by the first redistribution layer 20 being flattened. When flattening processing is not performed to the redistribution layer, the variation in thickness of the redistribution layer along the wafer surface exceeds ±30%. For example, when attempting to produce a redistribution layer of 8 μm thickness, thickness varied in a range of 5.6 μm to 10.4 μm. In contrast, by flattening processing a significant reduction in the variation of thickness of the redistribution layer is seen, dropping to within a range of 7.2 μm to 8.8 μm. The electrical properties of the semiconductor device, as represented by the Quality Factor, is thereby raised.

Processes for Forming the Post Electrode

Figure 11:
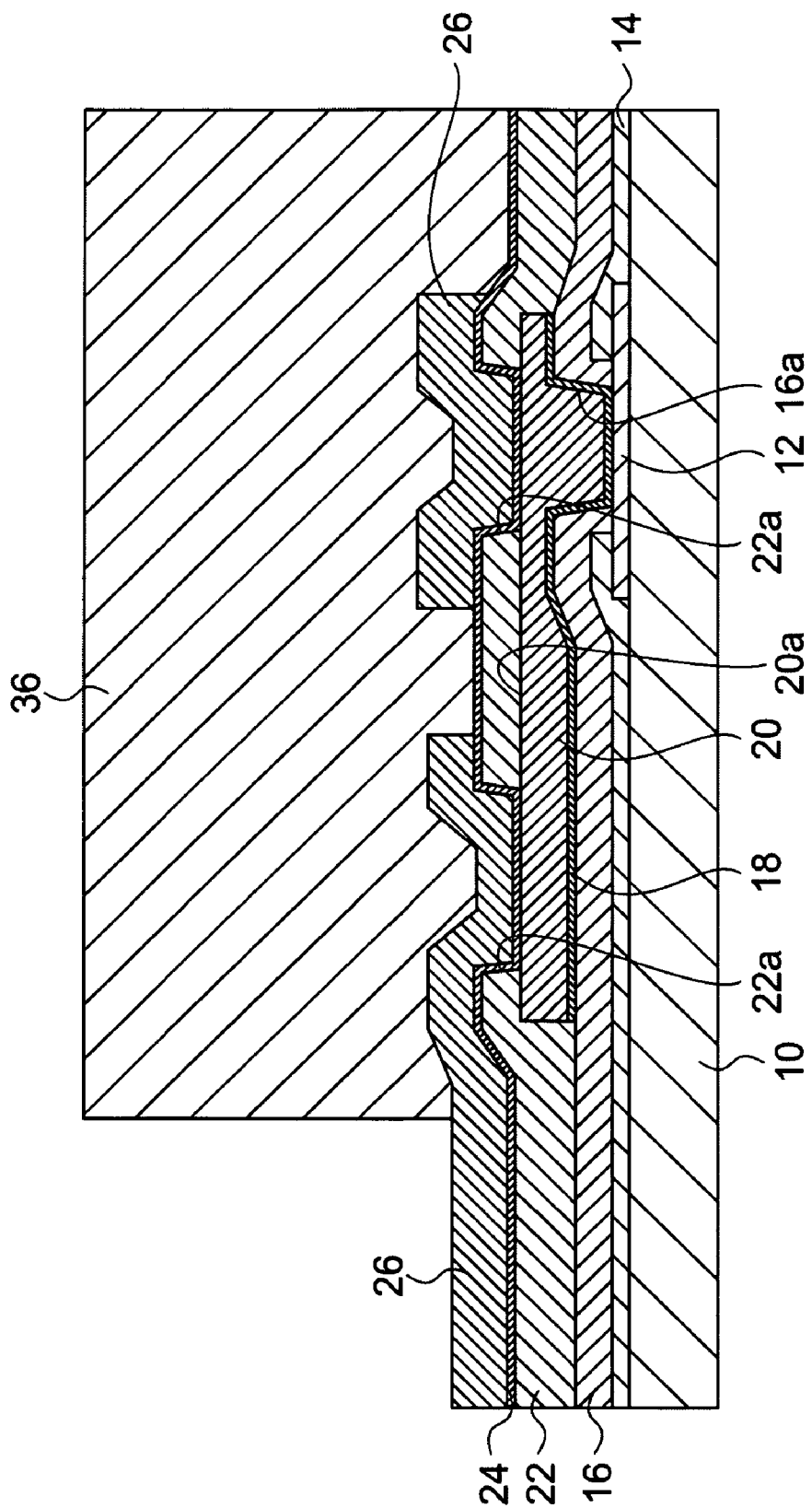

Next, as shown in FIG. 11, a dry film resist DF 36 is stuck on the main surface of the semiconductor wafer 10 formed with the second redistribution layer 26. The dry film resist DF 36 is patterned with the desired pattern using photolithography. Namely, the dry film resist DF 36 is removed from the region where the post electrode 28 is to be formed, exposing the surface of the second redistribution layer 26. As shown in FIG. 1, next the post electrode 28 is formed by growing the second electrically conductive material from the exposed surface of the second redistribution layer 26 using electroplating.

Finally, the remaining resist film 36 is removed, then the second UBM layer 24 is removed at the portions where the second redistribution layer 26 is not stacked. As described above, when the UBM layer is made from Ti and Cu, for example, the Cu layer is removed by etching, and then the Ti layer is removed by etching. The surface of the second insulating layer 22 is exposed at portions where the second UBM layer 24 is removed. Thereby, the semiconductor device 100 according to the first exemplary embodiment is completed.

Note that the processes set out below are additionally performed when the surface of the semiconductor device 100 is covered with a protective film and the end portion of the post electrode 28 is connected to an external connection terminal. Namely, after forming the post electrode 28, the main surface of the semiconductor wafer 10, on which the post electrode 28 has been formed, is covered with a protective film, using a resin mold or the like. Then, the protective film is machined, exposing the surface of the post electrode 28. An external connection terminal, such as a solder ball or the like, is connected to the surface of the post electrode 28, and a WCSP of multilayer redistribution structure is obtained. Furthermore, in the case of a multilayer structure having further redistribution layer(s), the post electrode 28 is formed after such multilayer redistribution layer(s) have been formed in sequence, in a similar manner to forming either the first redistribution layer 20 or the second redistribution layer 26. Flattening processing can be executed to the other redistribution layers too.

As explained above, in the first exemplary embodiment, since the first redistribution layer is formed with a surface flattened by flattening processing, variation in the thickness of the redistribution layer along the wafer surface is reduced, and the electrical properties of the semiconductor, as represented by the Quality Factor, are raised. In particular, in stacked structures where the influence of undulations in lower layers (base substrate pattern) is great, the influence on the electrical properties can be reduced since variation is small in the thickness of the first redistribution layer, the layer formed furthest down in the redistribution layers.

Second Exemplary Embodiment

Figure 12:
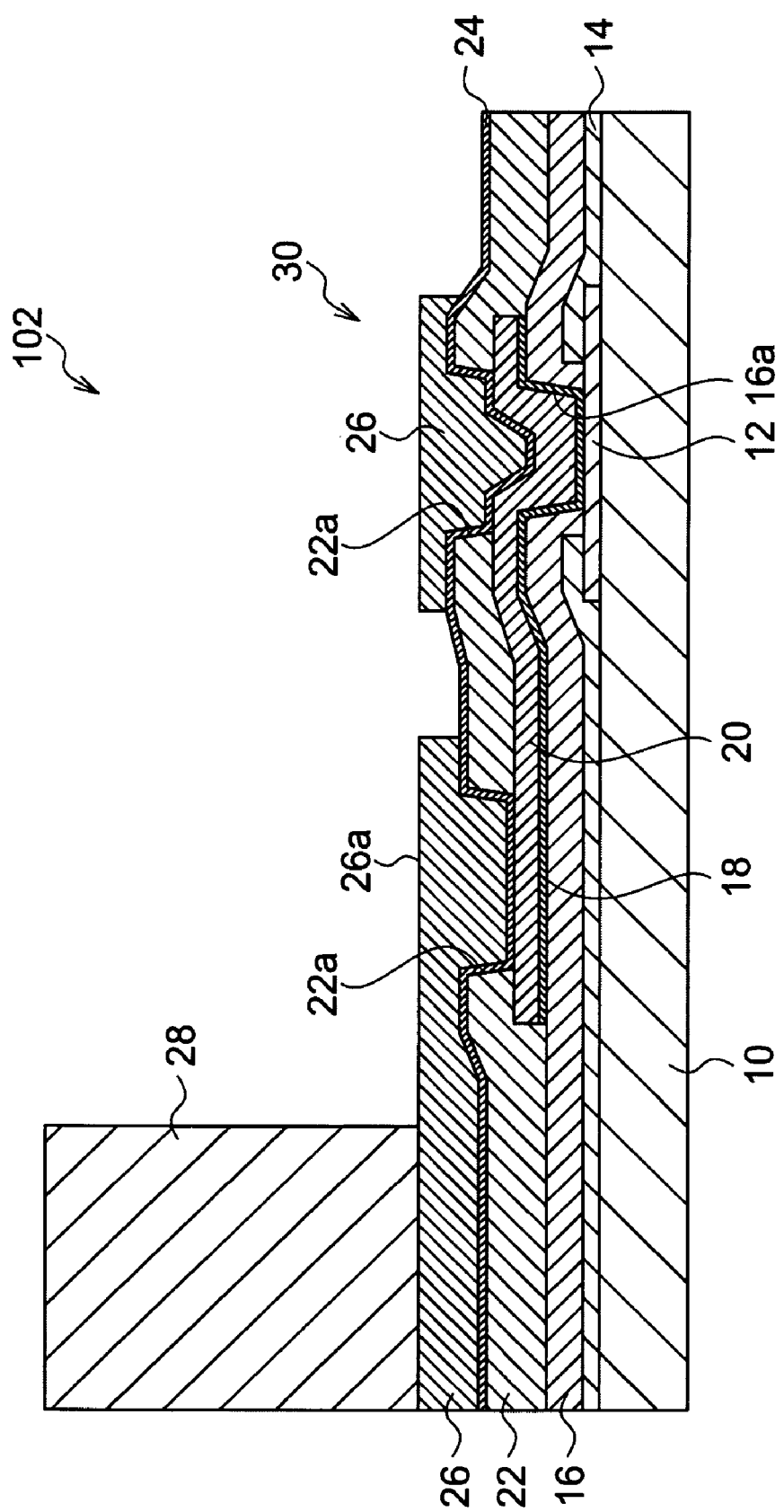
FIG. 12 is a partial cross-section showing an example of a multilayered structure of a semiconductor device according to a second exemplary embodiment of the present invention.

FIG. 12 is a partial cross-section showing an example of a multilayered structure of a semiconductor device according to a second exemplary embodiment of the present invention. A semiconductor device 102 according to the second exemplary embodiment, is similar to the semiconductor device 100 according to the first exemplary embodiment (see FIG. 1), equipped with: a semiconductor wafer 10; an electrode pad 12; a passivation film 14; a first insulation layer 16; a first opening 16a; a first UBM layer 18; a first redistribution layer 20; a second insulating layer 22; a second opening 22a; a second UBM layer 24; a second redistribution layer 26; and a post electrode 28.

In the semiconductor device 102, the surface of the second redistribution layer 26 is flattened, reducing the variation in thickness of the redistribution layers overall. The via portions of the first redistribution layer 20 and the second redistribution layer 26 are respectively superimposed on the electrode pad 12, forming a stacked structure 30. Note that points relating to provision of the protective film and external electrical connection are similar to those of the semiconductor device 100 according to the first exemplary embodiment.

Explanation will now be given of the structure of the semiconductor device 102 according to the second exemplary embodiment, following the manufacturing processes thereof. FIG. 13 to FIG. 20 are partial cross-sections representing manufacturing processes of a semiconductor device according to the second exemplary embodiment. A partial structure of one electrode pad's worth is shown in each of the respective drawings.

Processes for Forming the First Insulation Layer

Since the processes for forming the first insulation layer 16 (see FIG. 2 and FIG. 3) are similar to those of the semiconductor device 100 according to the first exemplary embodiment, the same reference numerals are allocated and explanation is omitted.

Processes for Forming the First Redistribution Layer

As shown in FIG. 3, the first UBM layer 18 is formed as a film with substantially uniform thickness on the first insulation layer 16, following the undulations of the surface. A resist film 32, patterned by photolithography to give the desired redistribution pattern, is formed on the first UBM layer 18. The resist film 32 is removed in the region to be formed with the first redistribution layer 20, and the surface of the first UBM layer 18 exposed.

Figure 13:
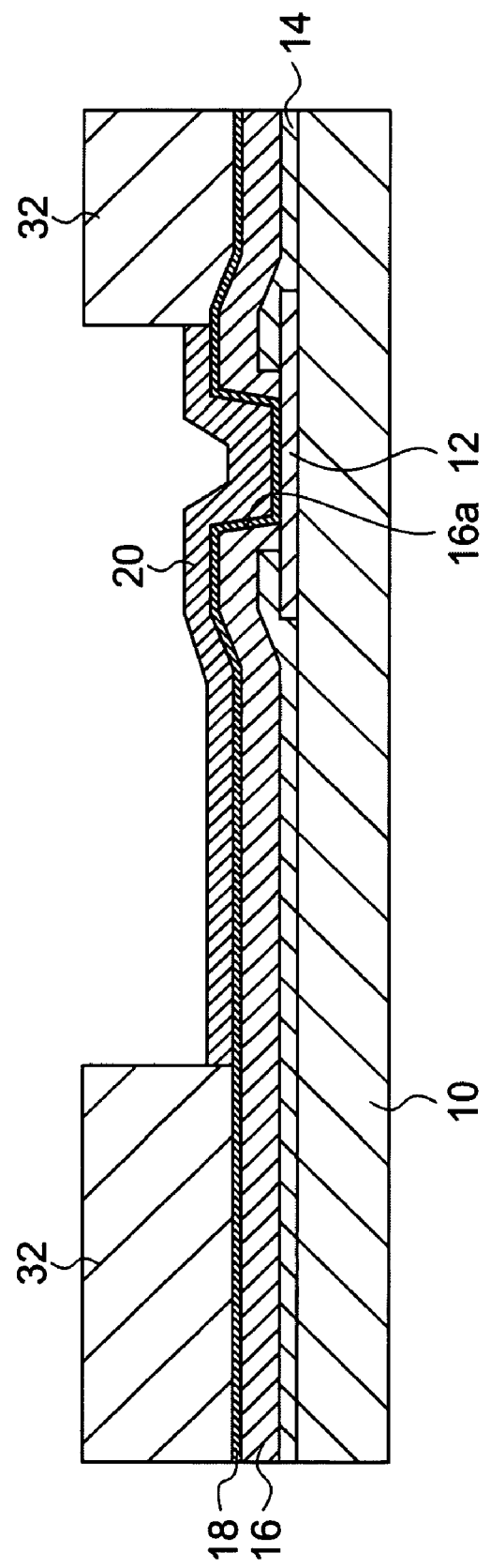
FIG. 13 to FIG. 20 are partial cross-sections representing manufacturing processes of a semiconductor device according to the second exemplary embodiment.
Figure 14:
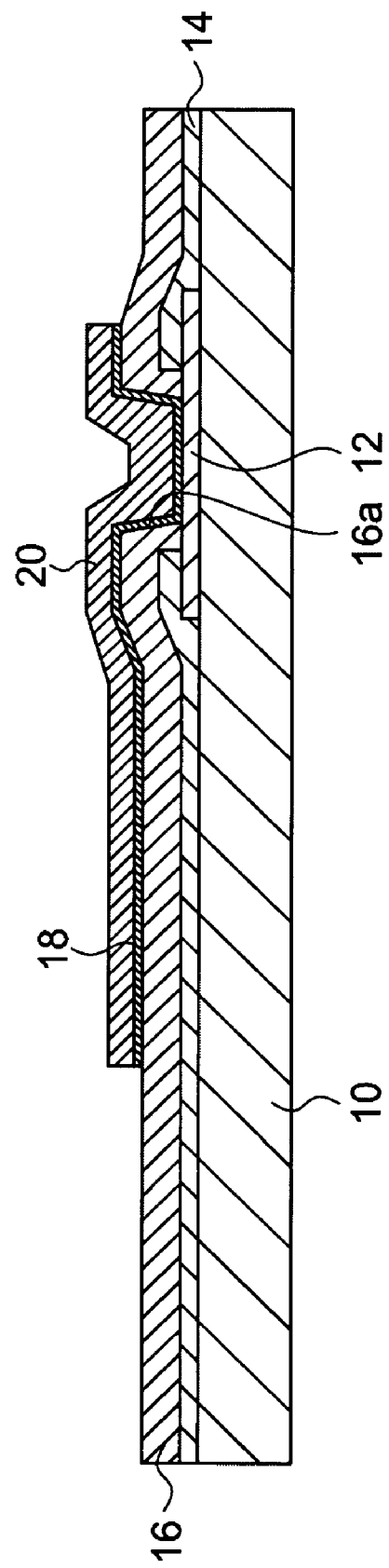

Next, as shown in FIG. 13, a first electrically conductive material is grown from the exposed surface of the first UBM layer 18 using electroplating, and the first redistribution layer 20 is formed. Next, as shown in FIG. 14, the remaining resist film 32 is removed, and then the UBM layer 18 is removed from the region where the first redistribution layer 20 is not stacked. The surface of the first insulation layer 16 is exposed at the portion where the first UBM layer 18 is removed. The first redistribution layer 20 making contact with the electrode pad 12 is thereby completed.

The first redistribution layer 20 is formed at a substantially uniform thickness, flowing the contours of the surface, to give a structure that dips inwards at the portion where the first opening 16a is formed. In the present exemplary embodiment, this portion corresponds to the via portion of the first redistribution layer 20.

Processes for Forming the Second Insulating Layer

Figure 15:
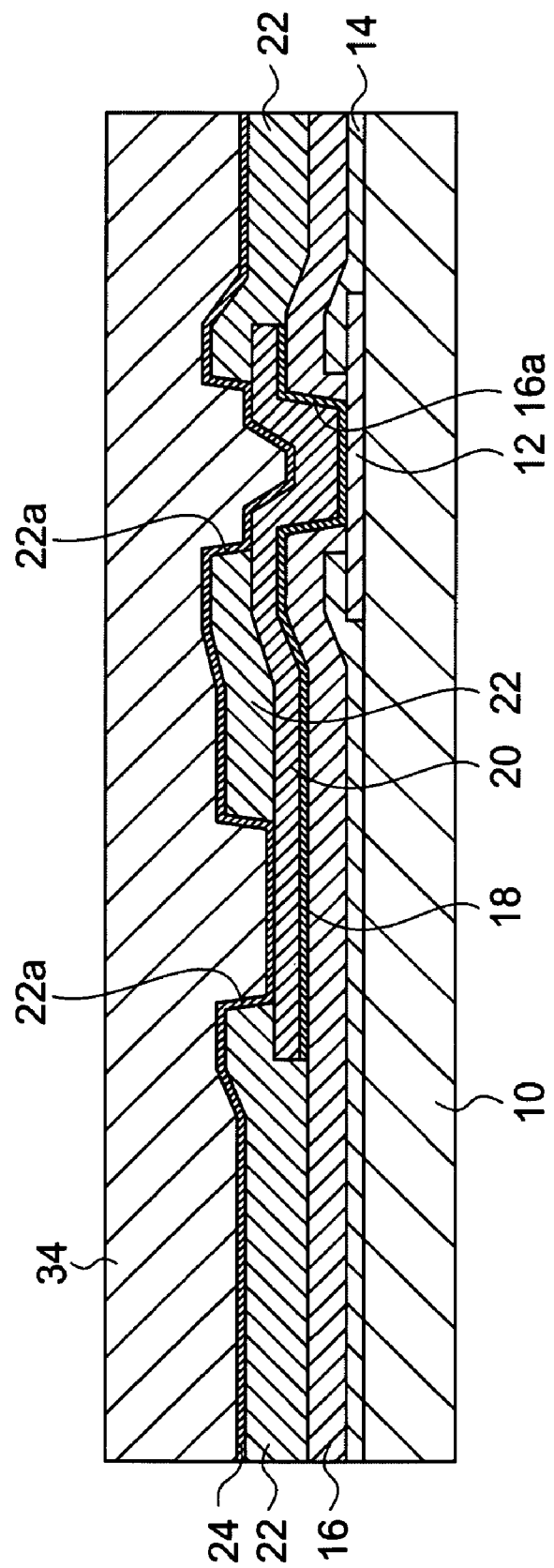

FIG. 15 shows a partial cross-section representing a process for forming the second insulating layer 22. As shown in FIG. 15, the second insulating layer 22 is formed from a photosensitive resin, such as PBO or the like, on the main surface of the semiconductor wafer 10 formed with the first redistribution layer 20. The second openings 22a are formed by photo-exposing and development processing the second insulating layer 22, in order to expose portions of the first redistribution layer 20. The size of the second openings 22a is larger than the size of the first opening 16a, and the second insulating layer 22 is removed at the portion facing the first opening 16a.

Processes for Forming the Second Redistribution Layer

Figure 16:
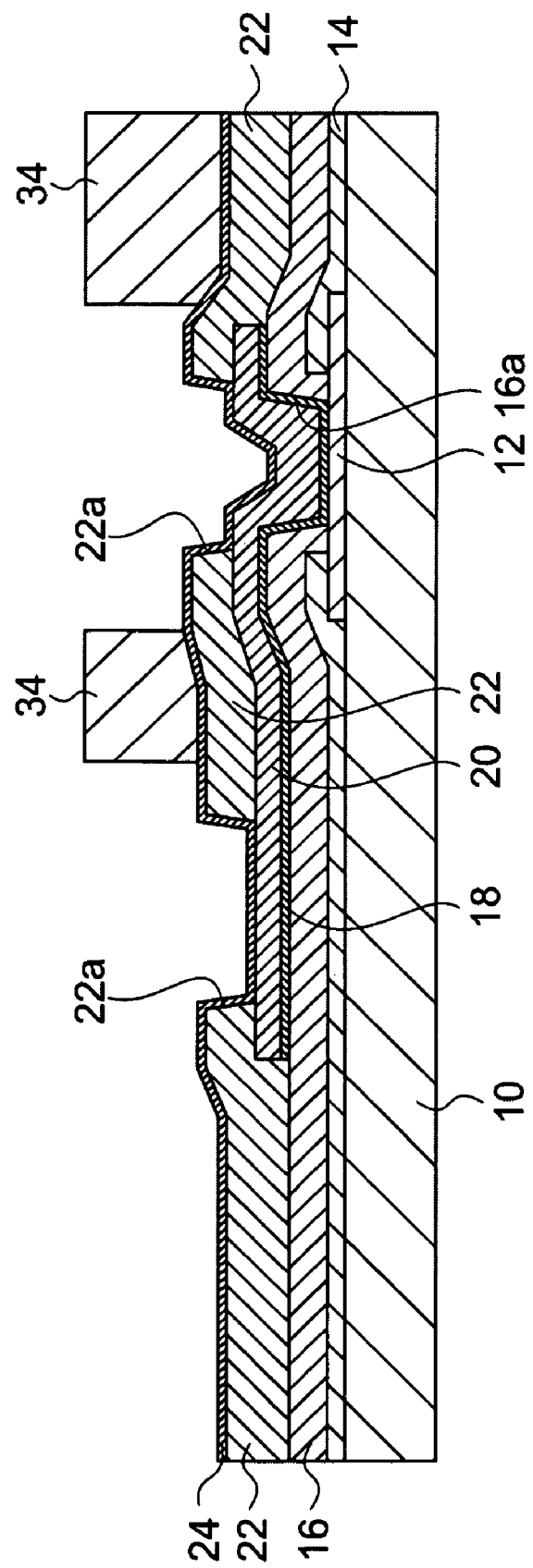

After forming the second insulating layer 22, the second UBM layer 24 is formed as a thin film on the second insulating layer 22. The second UBM layer 24 is formed of substantially uniform thickness following the undulations of the surface, to give a structure that dips inwards at the via portion of the first redistribution layer 20. Next, a resist film 34 is formed from a photoresist material on the second UBM layer 24. As shown in FIG. 16, the resist film 34 is patterned with the desired redistribution pattern by photolithography. Namely, the resist film 34 is removed in the regions where the second redistribution layer 26 is to be formed, exposing the surface of the second UBM layer 24.

Figure 17:
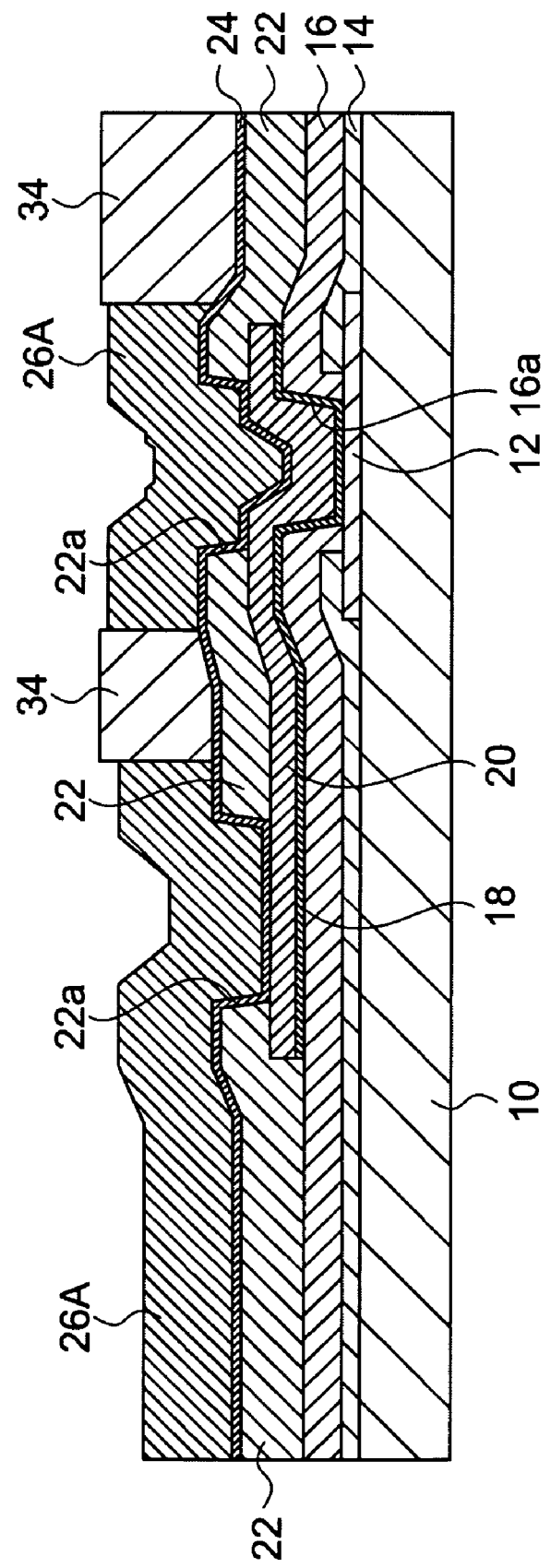

Next, as shown in FIG. 17, the second electrically conductive material is grown from the exposed surface of the second UBM layer 24 using electroplating, forming a second electrically conductive material layer 26A. The second electrically conductive material layer 26A is formed thicker than the predefined thickness of the second redistribution layer 26. For example, the second electrically conductive material layer 26A is formed such that when the second electrically conductive material layer 26A has been polished to the lowest portion, the second redistribution layer 26 is the predefined thickness. The second electrically conductive material layer 26A is preferably formed so as not to exceed the height of the resist film 34.

Figure 18:
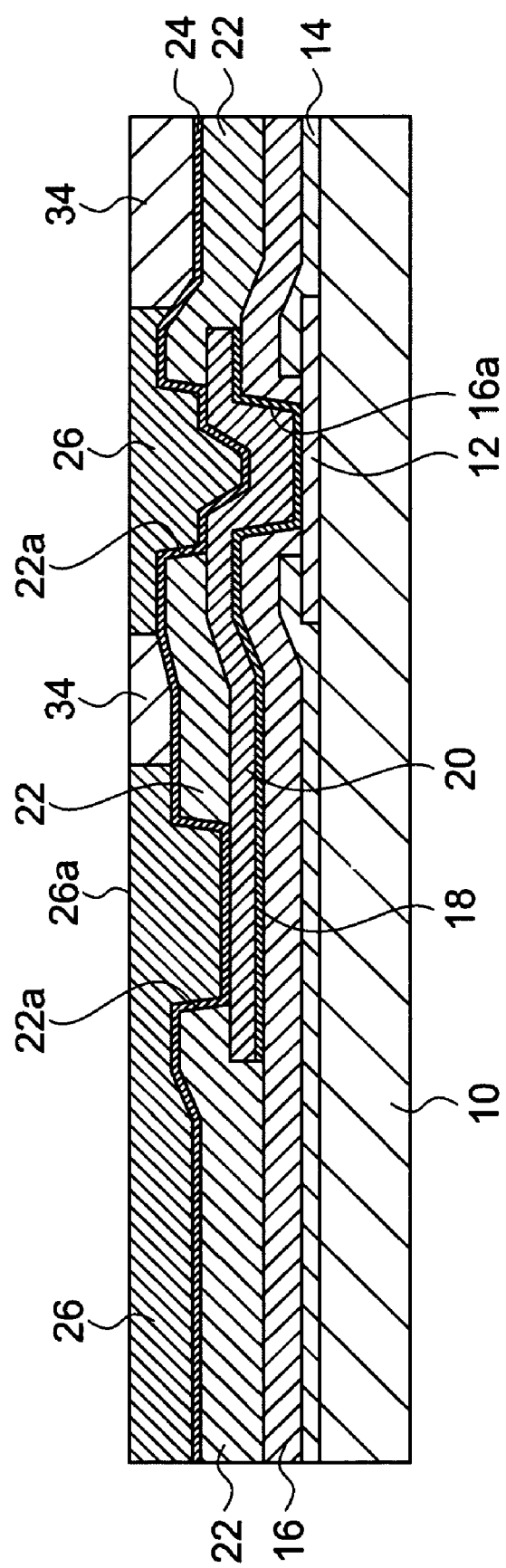

Next, as shown in FIG. 18, the surface formed by the resist film 34 and the second electrically conductive material layer 26A is flattened, by flattening processing that polishes the semiconductor wafer 10 from the main surface side with a grinder, and the second redistribution layer 26 is formed. Polishing with the grinder is performed across the entire main surface of the semiconductor wafer 10. The resist film 34 acts here as a protective film to the base substrate pattern.

Figure 19:
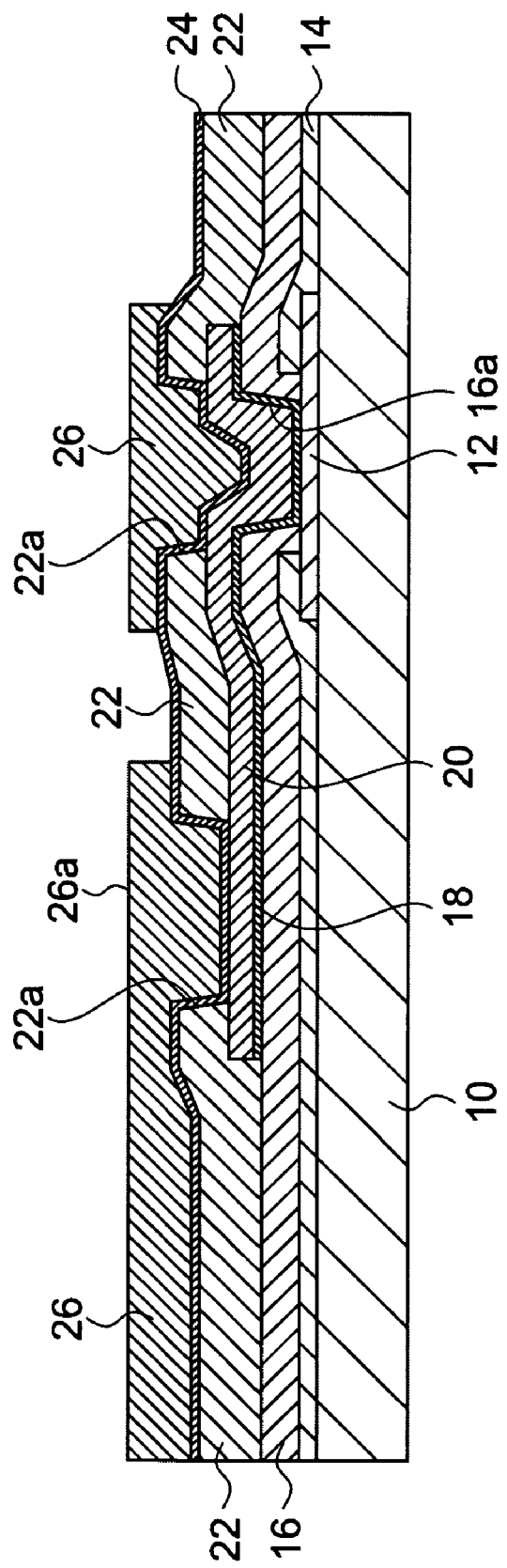

Next, as shown in FIG. 19, the remaining resist film 34 is removed. The second redistribution layer 26 making contact with the first redistribution layer 20 is thereby completed. Due to the above flattening processing, the distance between the surface 26a of the second redistribution layer 26 and the surface of the semiconductor wafer 10 becomes uniform. Furthermore, the portion of the second redistribution layer 26 formed in the second opening 22a is made thicker than other portions of the second redistribution layer 26. In particular, the portion corresponding to the via portion of the first redistribution layer 20 becomes thicker than other portions of the second redistribution layer 26. In the present exemplary embodiment this portions corresponds to the via portion of the second redistribution layer 26. The via portion of the second redistribution layer 26 is superimposed on the via portion of the first redistribution layer 20, configuring a stacked structure.

The semiconductor device 102 according to the present exemplary embodiment has two redistribution layers, the first redistribution layer 20 and the second redistribution layer 26. The variation in thickness of the redistribution layers along the wafer surface is reduced to within ±10% by the second redistribution layer 26 being flattened. The electrical properties of the semiconductor device, as represented by the Quality Factor, are thereby raised.

Processes for Forming the Post Electrode

Figure 20:
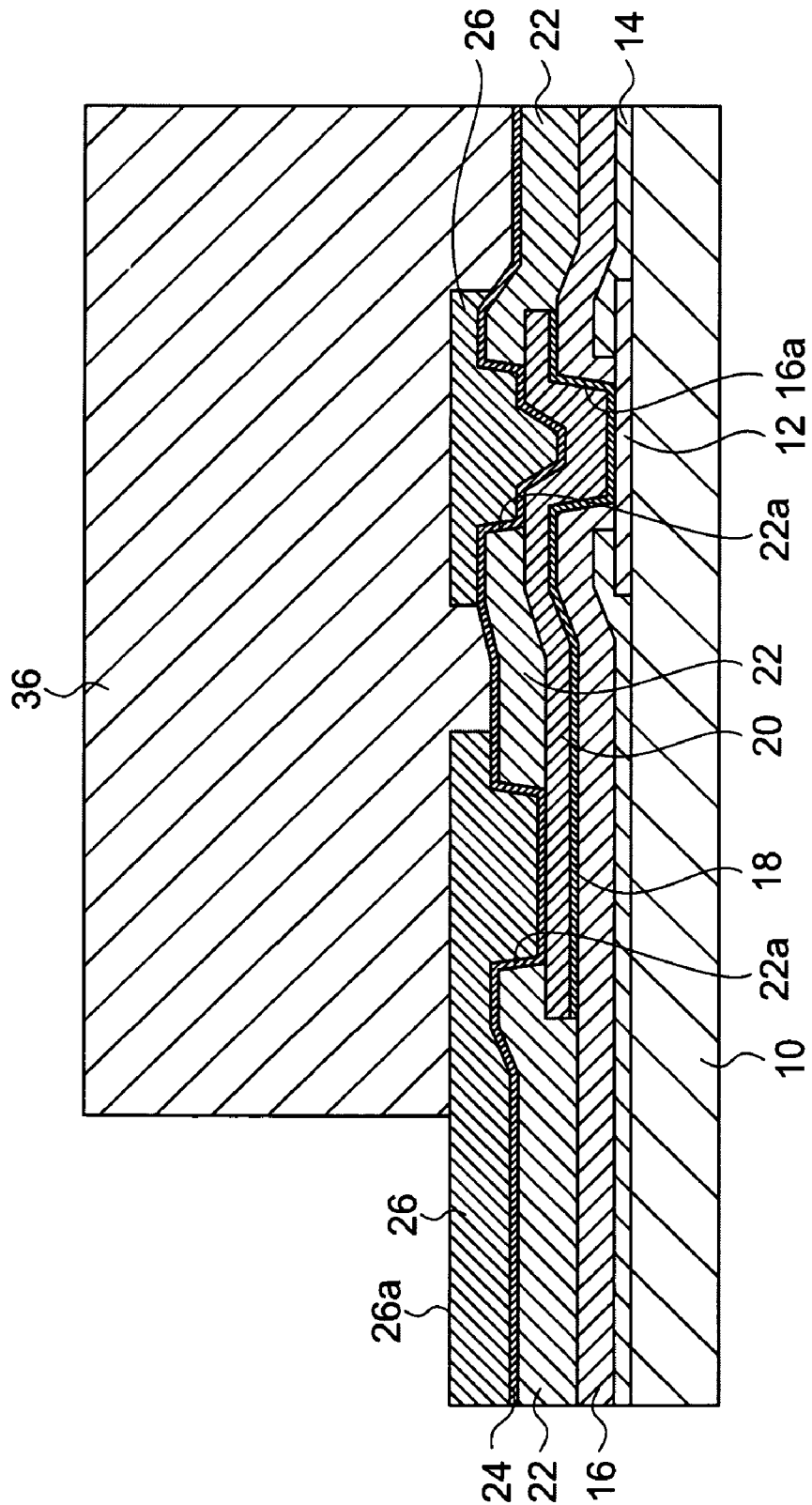

Next, as shown in FIG. 20, a dry film resist DF 36 is stuck on the main surface of the semiconductor wafer 10 formed with the second redistribution layer 26 and patterned with the desired pattern. Namely, the dry film resist DF 36 is removed from the region where the post electrode 28 is to be formed, exposing the surface of the second redistribution layer 26. As shown in FIG. 12, next the second electrically conductive material is grown from the exposed surface of the second redistribution layer 26 using electroplating, and the post electrode 28 is formed.

Finally, the remaining resist film 36 is removed, then the second UBM layer 24 is removed at the portions where the second redistribution layer 26 is not stacked. The surface of the second insulating layer 22 is exposed at portions where the second UBM layer 24 is removed. Thereby, the semiconductor device 102 according to the second exemplary embodiment is completed.

As explained above, in the second exemplary embodiment, due to the second redistribution layer being a layer formed with its surface flattened by the flattening processing, variation in thickness of the redistribution layer along the wafer surface is reduced, raising the electrical properties of the semiconductor device, as represented by the Quality Factor. In particular, since variation is made small in the thickness of the second redistribution layer, the layer formed uppermost in the redistribution layers, when considering the device overall, the variation in the thickness of the redistribution layers is reduced in comparison to the first exemplary embodiment where the first redistribution layer is flattened, and the electrical properties are raised.

Third Exemplary Embodiment

Figure 21:
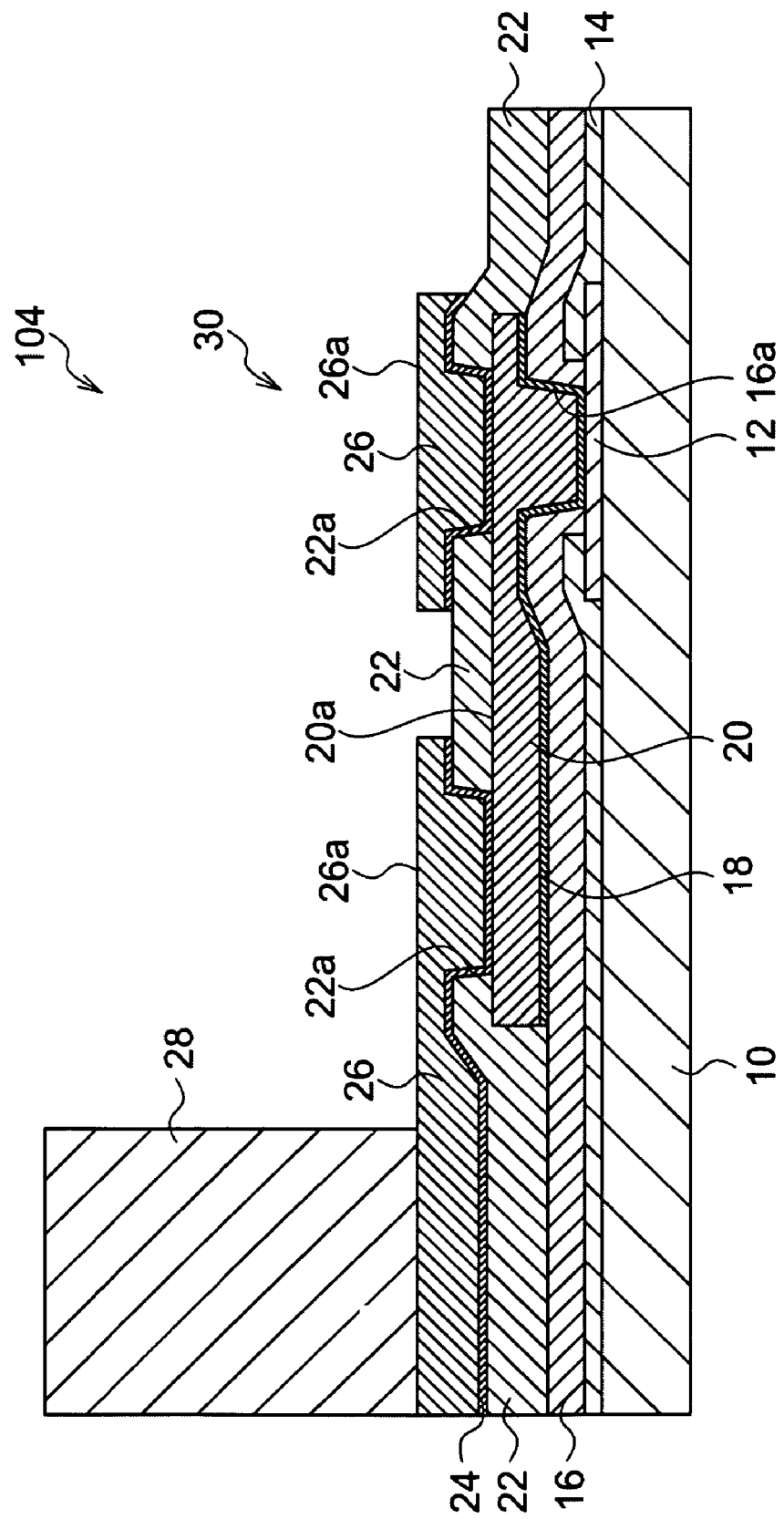
FIG. 21 is a partial cross-section showing an example of a multilayered structure of a semiconductor device according to a third exemplary embodiment of the present invention.

FIG. 21 is a partial cross-section showing an example of a multilayered structure of a semiconductor device according to a third exemplary embodiment of the present invention. A semiconductor device 104 according to the third exemplary embodiment is, similar to the semiconductor device 100 according to the first exemplary embodiment (see FIG. 1), equipped with: a semiconductor wafer 10; an electrode pad 12; a passivation film 14; a first insulation layer 16; a first opening 16a; a first UBM layer 18; a first redistribution layer 20; a second insulating layer 22; second openings 22a; a second UBM layer 24; a second redistribution layer 26; and a post electrode 28.

In the semiconductor device 104, the surfaces of the first redistribution layer 20 and the second redistribution layer 26 are flattened, reducing the variation in thickness of the redistribution layers overall. Furthermore, the via portions of the first redistribution layer 20 and the second redistribution layer 26 are respectively superimposed on the electrode pad 12, forming a stacked structure 30. Note that points relating to provision of the protective film and external electrical connection are similar to those of the semiconductor device 100 according to the first exemplary embodiment.

Figure 22:
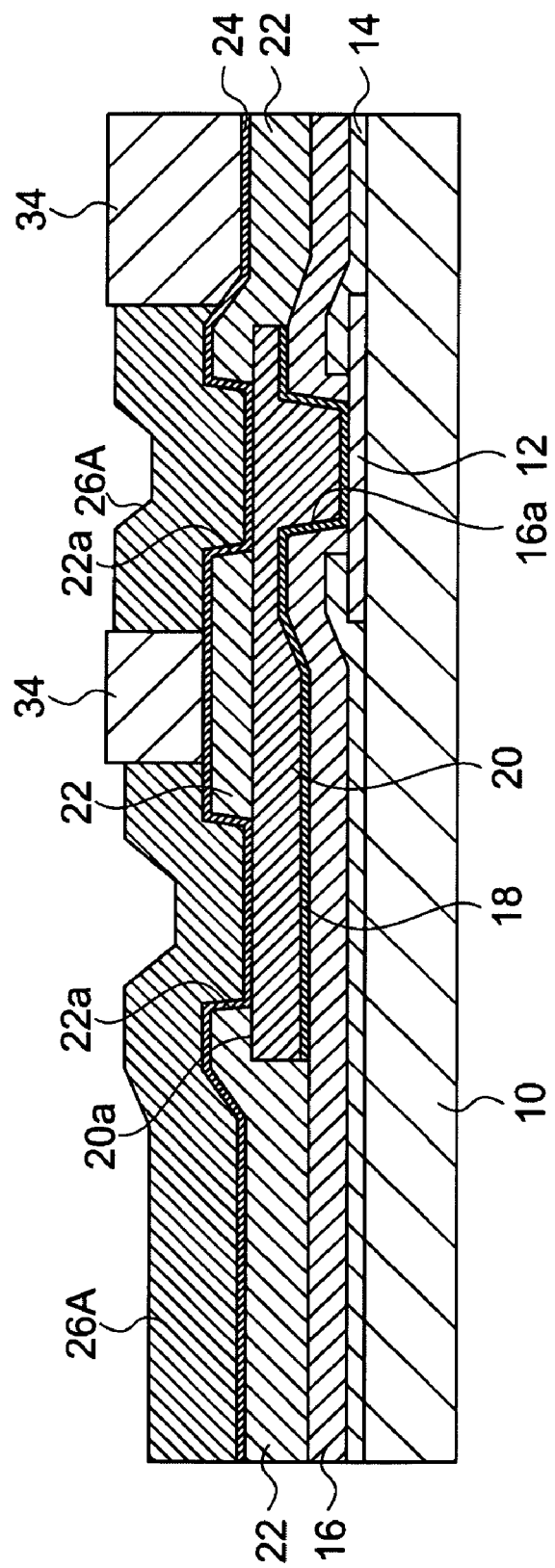
FIG. 22 to FIG. 25 are partial cross-sections representing manufacturing processes of a semiconductor device according to the third exemplary embodiment of the present invention.
Figure 23:
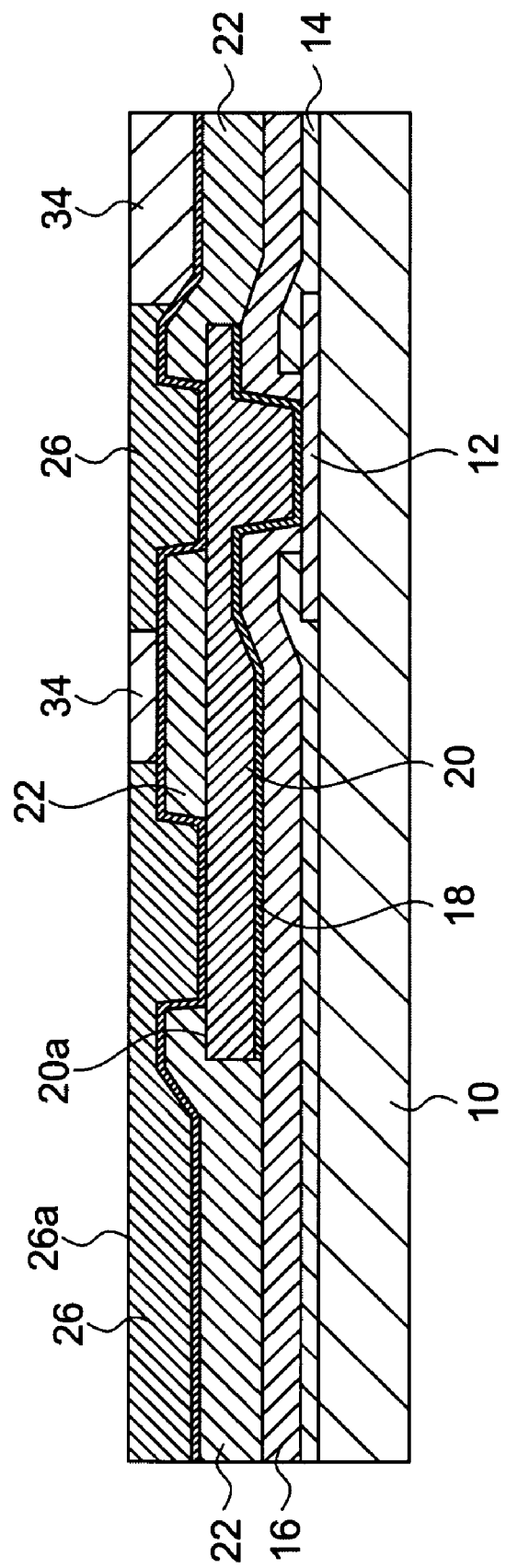
Figure 24:
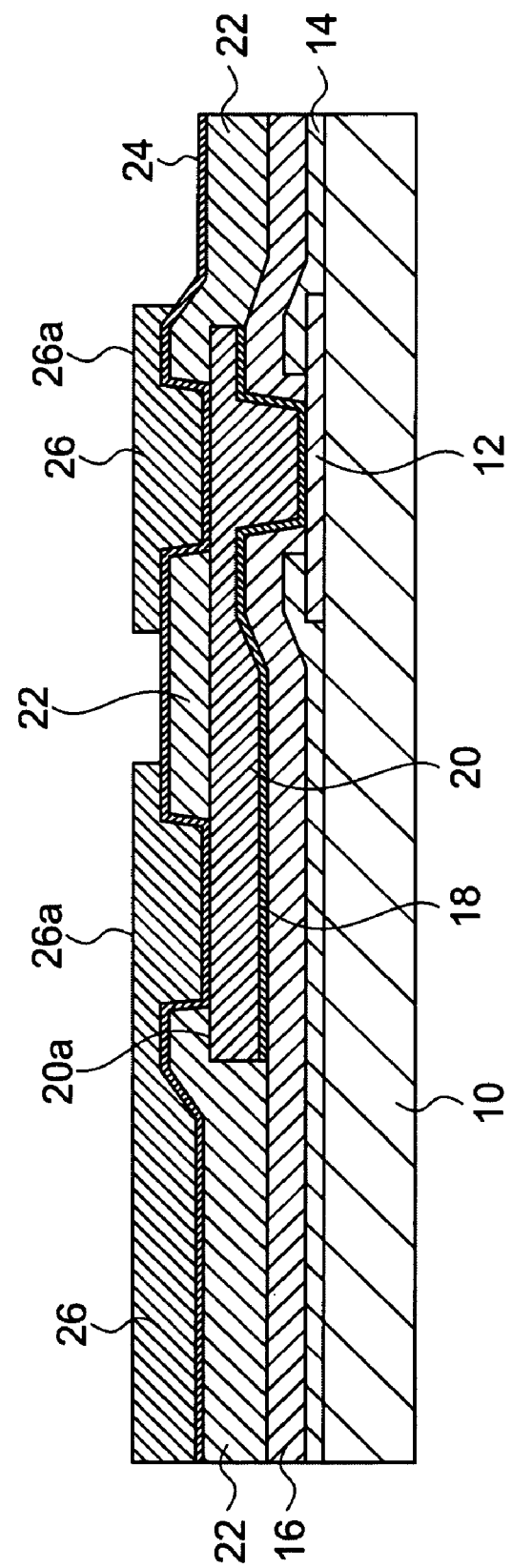

Explanation will now be given of the structure of the semiconductor device 104 according to the third exemplary embodiment, following the manufacturing processes thereof. FIG. 22 to FIG. 24 are partial cross-sections representing manufacturing processes of a semiconductor device according to the third exemplary embodiment. A partial structure of one individual electrode pad is shown in each of the drawings.

Processes for Forming the First Insulation Layer, the First Redistribution Layer, and the Second Insulating Layer Since the processes prior to the process for forming the second redistribution layer 26 (see FIG. 2 to FIG. 8) are similar to those of the semiconductor device 100 according to the first exemplary embodiment, the same reference numerals are allocated and explanation is abbreviated. Similar to in the first exemplary embodiment, the surface of the first redistribution layer 20 is flattened by the above flattening processing, and the distance between the surface 20a of the first redistribution layer 20 and the semiconductor wafer 10 is made uniform. Furthermore, the portion of the first redistribution layer 20 formed in the first opening 16a is made thicker than the other portions of the first redistribution layer 20. In the present exemplary embodiment, this portion corresponds to the via portion of the first redistribution layer 20.

Processes for Forming the Second Redistribution Layer

As shown in FIG. 8, the resist film 34 is formed from a photoresist material on the second UBM layer 24. Then the resist film 34 is patterned with the desired redistribution pattern using photolithography. Namely, the resist film 34 is removed in the regions where the second redistribution layer 26 is to be formed, exposing the surface of the second UBM layer 24.

Next, as shown in FIG. 22, the second electrically conductive material is grown from the exposed surface of the second UBM layer 24 using electroplating, forming the second electrically conductive material layer 26A. The second electrically conductive material layer 26A is formed thicker than the predefined thickness of the second redistribution layer 26. Next, as shown in FIG. 23, the surface formed by the resist film 34 and the second electrically conductive material layer 26A is flattened by the above flattening processing, forming the second redistribution layer 26. When this is performed, the resist film 34 also acts as a protective film for the base substrate pattern.

Next, as shown in FIG. 24, the remaining resist film 34 is removed. The second redistribution layer 26 making contact with the first redistribution layer 20 is thereby completed. Due to the above flattening processing, the distance between the surface 26a of the second redistribution layer 26 and the surface of the semiconductor wafer 10 is made uniform. Furthermore, the portion of the second redistribution layer 26 formed in the second opening 22a is made thicker than other portions of the second redistribution layer 26. In the present exemplary embodiment this portion corresponds to the via portion of the second redistribution layer 26. The via portion of the second redistribution layer 26 is superimposed on the first via interconnect 20b, configuring a stacked structure.

The semiconductor device 104 of the present exemplary embodiment has two redistribution layers, the first redistribution layer 20 and the second redistribution layer 26. Since the first redistribution layer 20 and the second redistribution layer 26 are flattened, the variability of the redistribution layers along the wafer surface is reduced to within ±10%. The electrical properties of the semiconductor device, as represented by the Quality Factor, are thereby raised.

Processes for Forming the Post Electrode

Figure 25:
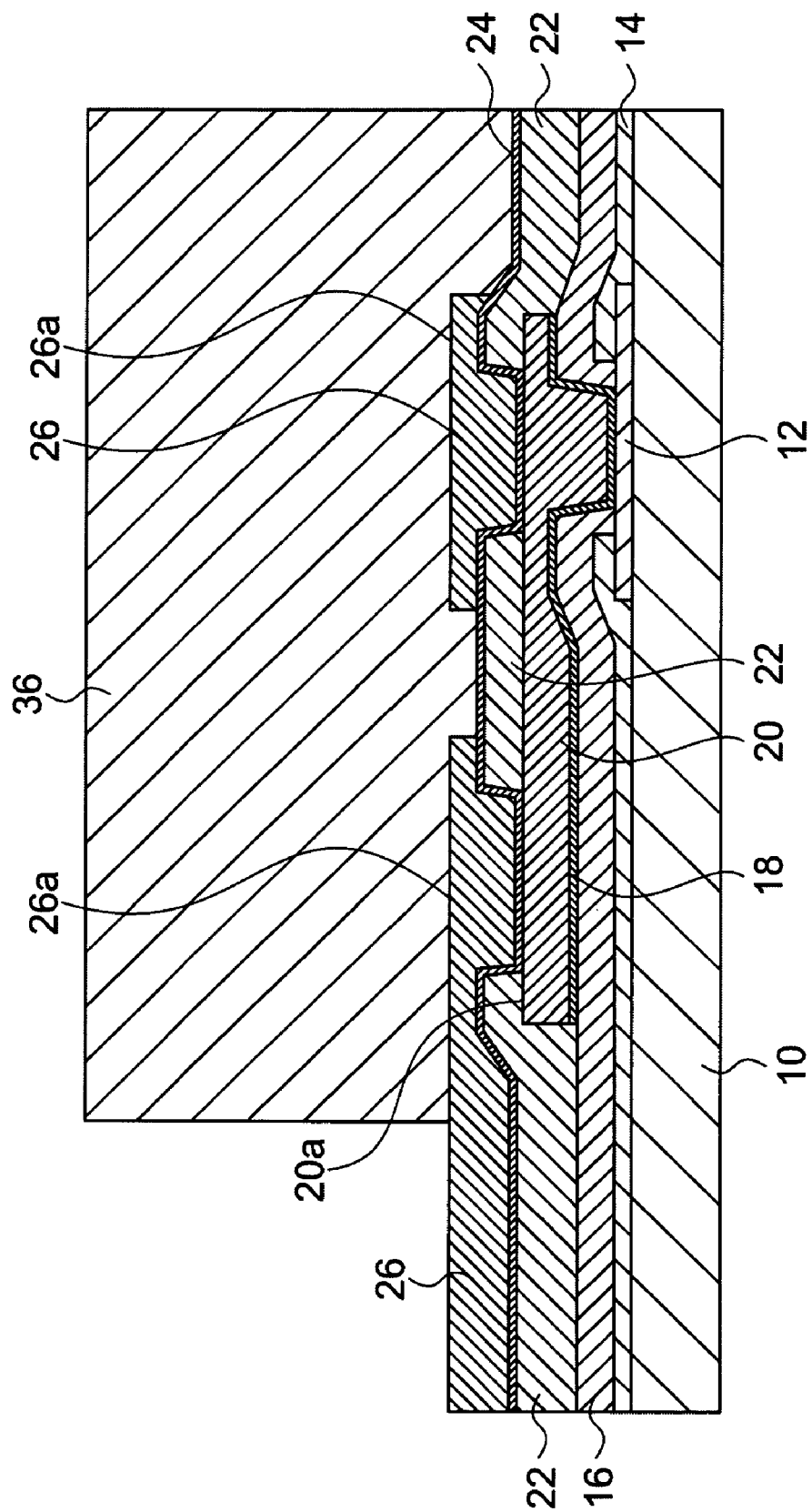

Next, as shown in FIG. 25, the dry film resist DF 36 is stuck to the main surface of the semiconductor wafer 10 formed with the second redistribution layer 26, and patterned with the desired pattern. Namely, the dry film resist DF 36 is removed from the region where the post electrode 28 is to be formed, exposing the surface of the second redistribution layer 26. As shown in FIG. 21, next the second electrically conductive material is grown from the surface of the second redistribution layer 26 using electroplating, forming the post electrode 28.

Finally, the remaining resist film 36 is removed, and then the second conductive material layer 24 is removed from the portion not stacked with the second redistribution layer 26. The surface of the second insulating layer 22 is exposed at the portions where the second conductive material layer 24 has been removed. The semiconductor device 104 of the third exemplary embodiment is thereby completed.

As explained above, in the third exemplary embodiment, since the first redistribution layer 20 and the second redistribution layer 26 are flattened by flattening processing, when the device is considered overall, the variation in thickness of the redistribution layers along the wafer surface is significantly reduced, and the electrical properties of the semiconductor device, as represented by the Quality Factor, are raised. Furthermore, similar to in the first exemplary embodiment, in a stacked structure that is greatly influence by the base substrate pattern, the influence on the electrical properties can be reduced, since there is small variation in the thickness of the first redistribution layer, the layer that is formed at the lowermost position in the redistribution layers.

Note that while explanation has been given in the above exemplary embodiments regarding a WCSP of a multilayer redistribution structure equipped with a stacked structure, the present invention may be applied to a WCSP of other multilayer redistribution structure. Whilst a more significant effect is exhibited from flattening the redistribution layers in stacked structures that are greatly influenced by the base substrate pattern, an effect from flattening the redistribution layers can also be obtained in WCSPs of other multilayer redistribution structures.

Furthermore, in the above exemplary embodiments, examples where given where the surface of the redistribution layers was polished with a grinder in the flattening processing, due to the ease of application of grinder polishing to the manufacturing processes of a WCSP, however there is no limitation to this method of flattening processing. Flattening processing of Chemical Mechanical Polishing (CMP), etching, or the like, can be employed.

Furthermore, the above exemplary embodiments are only examples of manufacturing processes, and manufacturing processes are not limited thereto. Obviously appropriate changes may be made to the sequence of the finer processes, as long as the same structure can be manufactured.

Furthermore, in the above exemplary embodiments, explanation was given of an example of flattening the surface of redistribution layers, however there is no limitation of the layers subjected to flattening to just the redistribution layers. In consideration of the fact that undulations (base substrate pattern) of lower layers varies the thickness of the redistribution layers above, the layers other than the redistribution layers are also preferably flattened, in addition to flattening the redistribution layers.

What is claimed is:

1. A method of manufacturing a semiconductor device, the method comprising:
   preparing a semiconductor substrate formed with an electrode pad on a main surface side;
   forming a first insulating layer from an insulating material so as to cover main surfaces of the electrode pad and the semiconductor substrate;
   forming a first opening in the first insulating layer such that a portion of the electrode pad is exposed;
   forming a first electrically conductive layer containing a first electrically conductive material so as to cover the electrode pad and the first insulating layer;
   forming a first resist film on the first electrically conductive layer except in a portion where a first redistribution layer is to be formed;
   forming the first redistribution layer from the first electrically conductive material on the first electrically conductive layer, by growing the first electrically conductive material contained in the first electrically conductive layer using an electroplating method, and removing the first resist film;
   forming a second insulating layer from an insulating material so as to cover the first redistribution layer and the first insulating layer;
   forming a second opening in the second insulating layer such that a portion of the first redistribution layer is exposed;
   forming a second electrically conductive layer containing a second electrically conductive material so as to cover the first redistribution layer and the second insulating layer;
   forming a second resist film on the second electrically conductive layer except in a portion where a second redistribution layer is to be formed;
   forming the second redistribution layer from the second electrically conductive material on the second electrically conductive layer, by growing the second electrically conductive material contained in the second electrically conductive layer using an electroplating method, and removing the second resist film; and
   performing at least one of:
      processing, when forming the first redistribution layer, to form a first electrically conductive material layer by growing the first electrically conductive material using electroplating, and polishing the first resist film and the first electrically conductive material layer from the main surface side to flatten their surfaces; and
      processing, when forming the second redistribution layer, to form a second electrically conductive material layer by growing the second electrically conductive material using electroplating, and polishing the second resist film and the second electrically conductive material layer from the main surface side to flatten their surfaces.

2. The method of claim 1, wherein the first opening and the second opening are formed such that a via portion of the second redistribution layer formed above the first redistribution layer is superimposed in a stacking direction on a via portion of the first redistribution layer formed above the electrode pad, so as to form a stacked structure.

3. The method of claim 1, wherein at least one of the first electrically conductive material layer and the second electrically conductive material layer is polished from the main surface side to flatten the surface thereof, and at least one of the first insulating layer and the second insulating layer is polished from the main surface side to flatten the surface thereof.

4. The method of claim 1, wherein polishing is performed by a grinder.

5. The method of claim 1, wherein:
   the processing for forming the first redistribution layer is performed so that when the first resist film and the first electrically conductive material layer are polished from the main surface side to flatten the surfaces thereof, the first resist film is removed after the surfaces have been flattened; and
   the processing for forming the second redistribution layer is performed so that when the second resist film and the second electrically conductive material layer are polished from the main surface side to flatten the surfaces thereof, the second resist film is removed after the surfaces have been flattened.

6. The method of claim 1, wherein polishing is performed across the entire main surface of the semiconductor substrate.

7. The method of claim 1, wherein:
   the processing for forming the first redistribution layer is performed so that when the first resist film and the first electrically conductive material layer are polished from the main surface side to flatten the surfaces thereof, the first electrically conductive material layer is formed by growing the first electrically conductive material using electroplating so as not to exceed a height of the first resist film, and the first resist film is removed after the first electrically conductive material layer has been polished; and
   the processing for forming the second redistribution layer is performed so that when the second resist film and the second electrically conductive material layer are polished from the main surface side to flatten the surfaces thereof, the second electrically conductive material layer is formed by growing the second electrically conductive material using electroplating so as not to exceed a height of the second resist film, and the second resist film is removed after the second electrically conductive material layer has been polished.

8. A method of manufacturing a semiconductor device, the method comprising:
   preparing a semiconductor substrate formed, on a main surface side, with a first redistribution layer, and a first insulating layer provided with a first opening exposing a portion of the first redistribution layer;
   forming a first electrically conductive layer containing a first electrically conductive material so as to cover the first redistribution layer and the first insulating layer;
   forming a first resist film on the first electrically conductive layer except in a portion where a second redistribution layer is to be formed;

forming the second redistribution layer from the first electrically conductive material on the first electrically conductive layer, by growing the first electrically conductive material contained in the first electrically conductive layer using an electroplating method, and removing the first resist film;

forming a second insulating layer from an insulating material so as to cover the second redistribution layer and the first insulating layer;

forming a second opening in the second insulating layer such that a portion of the second redistribution layer is exposed;

forming a second electrically conductive layer containing a second electrically conductive material so as to cover the second redistribution layer and the second insulating layer;

forming a second resist film on the second electrically conductive layer except in a portion where a third redistribution layer is to be formed;

forming the third redistribution layer from the second electrically conductive material on the second electrically conductive layer, by growing the second electrically conductive material contained in the second electrically conductive layer using an electroplating method, and removing the second resist film; and performing at least one of:

processing, when forming the second redistribution layer, to form a first electrically conductive material layer by growing the first electrically conductive material using electroplating, and polishing the first resist film and the first electrically conductive material layer from the main surface side to flatten their surfaces; and processing, when forming the third redistribution layer, to form a second electrically conductive material layer by growing the second electrically conductive material using electroplating, and polishing the second resist film and the second electrically conductive material layer from the main surface side to flatten their surfaces.

* * * * *